(12) United States Patent
Bai et al.

(10) Patent No.: US 10,321,581 B2
(45) Date of Patent: Jun. 11, 2019

(54) SINGLE-LAYER CIRCUIT BOARD, MULTI-LAYER CIRCUIT BOARD, AND MANUFACTURING METHODS THEREFOR

(71) Applicant: RICHVIEW ELECTRONICS CO., LTD., Wuhan (CN)

(72) Inventors: Siping Bai, Zhuhai (CN); Xianglan Wu, Zhuhai (CN); Zhijian Wang, Zhuhai (CN); Zhigang Yang, Zhuhai (CN); Jinqiang Zhang, Zhuhai (CN)

(73) Assignee: RICHVIEW ELECTRONICS CO., LTD., Zhuhai, Guangdong (CN)

( * ) Notice: Subject to any disclaimer, the term of this patent is extended or adjusted under 35 U.S.C. 154(b) by 0 days.

(21) Appl. No.: 15/773,772

(22) PCT Filed: Nov. 23, 2016

(86) PCT No.: PCT/CN2016/000649
§ 371 (c)(1),
(2) Date: May 4, 2018

(87) PCT Pub. No.: WO2017/075908
PCT Pub. Date: May 11, 2017

(65) Prior Publication Data
US 2018/0324958 A1 Nov. 8, 2018

(30) Foreign Application Priority Data
Nov. 6, 2015 (CN) .......................... 2015 1 0747884

(51) Int. Cl.
*H05K 1/02* (2006.01)
*H05K 3/42* (2006.01)
(Continued)

(52) U.S. Cl.
CPC ............. *H05K 3/429* (2013.01); *C23C 14/48* (2013.01); *H05K 1/115* (2013.01); *H05K 3/42* (2013.01);
(Continued)

(58) Field of Classification Search
CPC ... H05K 1/02; H05K 3/00; H05K 3/46; H01L 21/02; H01L 21/20; H01L 21/70; H01L 23/48; H01L 23/52
(Continued)

(56) References Cited

U.S. PATENT DOCUMENTS 6,015,749 A * 1/2000 Liu ................... H01L 21/76843
257/E21.584
2005/0032352 A1* 2/2005 Farrar ............... H01L 21/76801
438/624
(Continued)

FOREIGN PATENT DOCUMENTS

| CN | 1319323 | 10/2001 |
| CN | 101594750 | 1/2011 |

(Continued)

OTHER PUBLICATIONS

Chinese Application No. 201510747884.1, Office Action dated Feb. 6, 2018, 22 pages (13 pages of Original Document and 9 pages of English Translation).
(Continued)

*Primary Examiner* — Xiaoliang Chen
(74) *Attorney, Agent, or Firm* — Kilpatrick Townsend & Stockton LLP

(57) ABSTRACT

A single-layer circuit board, multi-layer circuit board, and manufacturing methods therefor. The method for manufacturing the single-layer circuit board (10) comprises the following steps: drilling a hole on a substrate (11), the hole comprising a blind hole and/or a through hole (S1); on a
(Continued)

surface (12) of the substrate, forming a photoresist layer having a circuit negative image (S2); forming a conductive seed layer on the surface (12) of the substrate and a hole wall (19) of the hole (S3); removing the photoresist layer, and forming a circuit pattern on the surface (12) of the substrate (S4), wherein Step S3 comprises implanting a conductive material below the surface (12) of the substrate and below the hole wall (19) of the hole via ion implantation, and forming an ion implantation layer as at least part of the conductive seed layer.

4 Claims, 14 Drawing Sheets

(51) Int. Cl.
*C23C 14/48* (2006.01)
*H05K 1/11* (2006.01)

(52) U.S. Cl.
CPC . *H05K 2201/096* (2013.01); *H05K 2203/092* (2013.01)

(58) Field of Classification Search
USPC ............... 174/262, 251; 438/154, 624, 628; 257/751, 774
See application file for complete search history.

(56) References Cited

U.S. PATENT DOCUMENTS

| | | | |
|---|---|---|---|
| 2006/0006548 | A1* | 1/2006 | Farrar ............... H01L 21/76801 257/774 |
| 2014/0224526 | A1* | 8/2014 | Chiu .................... H05K 3/4673 174/251 |
| 2014/0353756 | A1* | 12/2014 | Yamamoto .......... H01L 27/1203 257/351 |

FOREIGN PATENT DOCUMENTS

| | | |
|---|---|---|
| CN | 102021576 | 4/2011 |
| CN | 102832138 | 12/2012 |
| CN | 103987189 | 8/2014 |
| CN | 104219899 | 12/2014 |
| CN | 105899003 | 8/2016 |
| WO | 2015149580 | 10/2015 |

OTHER PUBLICATIONS

International Application No. PCT/CN2016/000649, International Search Report and Written Opinion dated Mar. 1, 2017, 9 pages.

* cited by examiner

SINGLE-LAYER CIRCUIT BOARD, MULTI-LAYER CIRCUIT BOARD, AND MANUFACTURING METHODS THEREFOR

CROSS-REFERENCE TO RELATED APPLICATIONS

This application is a U.S. national stage application under 35 U.S.C § 371 of PCT/CN2016/000649, filed on Nov. 23, 2016, which claims the benefit of and priority to Chinese Patent Application No. 201510747884.1, filed Nov. 6, 2015, the contents of which are herein incorporated by reference in their entirety.

FIELD the invention relates to single-layer circuit board, multi-layer circuit board and manufacturing methods thereof. Especially, the invention relates to single-layer circuit board with insulated material having a hole as substrate and formed with conductor layer on the hole wall and formed with circuit pattern on the substrate surface, multi-layer circuit board laminated by plenty of single-layer circuit boards and wherein each single-layer circuit board is connected via metalized via hole, and manufacturing methods thereof.

BACKGROUND

In the circuit board industry, metalized via hole is widely used to connect surface of circuit board and circuit pattern on back side or electronic means or the like, or electrically connects conductor layer between each layer circuit board of double-layer or multi-layer circuit board to each other, so as to implement the design of multi-layer circuit pattern.

In the prior art, methods of manufacturing single-layer circuit board with metalized via hole mainly comprises the following steps: manufacturing copper foil via flattening or electroanalysis; bonding the copper foil on the substrate via high temperature lamination, to form overlaying copper plate; drilling a hole and removing dirt on the overlaying copper plate; forming conductive seed layer on the hole wall via processes of electroless copper (PTH) or black hole, shadow or the like; forming a metal conductor layer on the hole wall via electroplating, to form overlaying copper plate with metalized hole; covering the overlaying copper plate with photoresist film, using lithography machine for exposure and development, then implementing etching to remove copper layer outside of circuit region on the overlaying copper plate, thereby achieving circuit board with circuit pattern.

Additionally, manufacturing methods for multi-layer circuit board with metalized via hole mainly involves stitching, comprising the following steps: manufacturing single-layer circuit board; implementing laying-up plate and lamination in the order of copper foil, PP(prepreg), single-layer circuit board, PP, single-layer circuit board, . . . , PP, copper foil; drilling through hole for the multi-layer plate after lamination and drilling blind hole for upper layer copper foil, and implementing hole metalization; applying pattern electroplating or panel electroplating to uppermost layer and lowermost layer of the copper foil, achieving circuit pattern. Wherein hole metalization is also usually achieved via process of electroless copper or black hole, shadow or the like to form conductive seed layer on the hole wall and then via electroplating or the like to form conductor thickening layer.

In the process of forming single-layer or multi-layer circuit board with metalized hole via above-mentioned methods, if it is desired to drill a hole with diameter of less than 100 μm on the substrate, currently laser drilling technology has to be utilized. At the time, it need to implement thinning in advance to the part of copper foil to be drilled, afterward use laser to drill a hole, then after drilling the hole, implement electroless copper and electroplating. However, in the etching thinning process, once etching position generates deviation, it will result in that drilling position on the substrate also generates deviation. Also, when implementing metalization to mini-hole, binding force between electroplating copper layer and hole wall is weak, copper layer easily peels off from the hole wall. Additionally, the minimal diameter of micro-hole manufactured on the overlaying copper plate utilizing prior art is 20-50 μm, when the diameter is less than 20 μm, it will generate a hole with too high thickness-diameter ratio and problems of hole wall copper layer being nonuniform or the like will occur at the time of electroless copper and electroplating. Within micro-hole region, nonuniform distribution of current density will result in that the deposition rate of copper at micro-hole surface is larger than the deposition rate of hole wall and bottom. Therefore, void or crack easily forms in the deposition process, it will also result in that the copper thickness of hole surface is larger than the copper thickness of hole wall.

Additionally, above-mentioned methods of producing circuit board need to produce finished overlaying copper plate in advance, afterward implementing drilling and hole metalization to the finished overlaying copper plate, then make circuit pattern via procedure of pasting film, exposure and development, etching or the like, thus the process procedure is long, the producing cost is high. Also, because there are several metal etching in the whole process procedure, thus it will generate plenty of waste water containing metal ion, generating significant harm to environment.

BRIEF DESCRIPTION the invention is made in view of above-mentioned problems, the aim is to, provide single-layer circuit board with metalized hole, multi-layer circuit board and manufacturing methods thereof, to simplify the manufacturing procedure of circuit board, and improve conductive performance of metalized hole therein.

the first technology solution of the invention is methods for manufacturing single-layer circuit board, comprising the following steps: drilling a hole on a substrate, the hole comprises blind hole and/or through hole (S1); forming a photoresist layer having circuit negative image on the surface of the substrate (S2); forming a conductive seed layer on the surface of substrate and a hole wall of the hole (S3); and removing photoresist layer, to form circuit pattern on the surface of the substrate(S4), wherein step S3 comprises implanting a conductive material below the surface of the substrate and below the hole wall of the hole via ion implantation, to form ion implantation layer as at least part of the conductive seed layer.

According to such methods, metalized hole can be formed on a substrate and circuit pattern can be formed on the surface of such substrate via simple process procedure. When forming circuit pattern, because before forming conductive seed layer, photoresist film is overlaid in advance on the substrate surface and further forming a photoresist layer with circuit negative image, afterward using stripping liquid to dissolve such photoresist layer to make the conductive seed layer and/or conductor thickening layer in non-circuit region fall off together with photoresist layer, so there is no need to obtain circuit pattern via etching as prior art, or at least the using of etching liquid can decrease, thereby decreasing or eliminating the harm to the environment by etching waste water containing metal ion.

The second technology solution of the invention is that, in the first solution, step S3 further comprises depositing conductive material above ion implantation layer via plasma deposition, to form plasma deposition layer, the plasma deposition layer and the ion implantation layer constitute conductive seed layer.

The third technology solution of the invention is that, in the first solution, after step S3, before step S4, methods further comprises: forming conductor thickening layer on the conductive seed layer.

The forth technology solution of the invention is that, in the first solution, removing the photoresist layer comprising using stripping liquid to dissolve the photoresist layer.

The fifth technology solution of the invention is methods for manufacturing single-layer circuit board, comprising the following steps: drilling a hole on a substrate, the hole comprises blind hole and/or through hole (S1); forming a conductive seed layer on the surface of the substrate and a hole wall of the hole (S2); and forming circuit pattern on the surface of the substrate (S3), wherein step S2 comprises implanting a conductive material below the surface of the substrate and below the hole wall of the hole via ion implantation, to form ion implantation layer as at least part of the conductive seed layer.

The sixth technology solution of the invention is that, in the fifth solution, step S2 further comprises depositing a conductive material above the ion implantation layer via plasma deposition, to form a plasma deposition layer, the plasma deposition layer and the ion implantation layer constitute the conductive seed layer.

The seventh technology solution of the invention is that, in the fifth solution, step S3 comprises: first forming a conductor thickening layer on the conductive seed layer, then implementing pattern electroplating or panel electroplating on the conductor thickening layer located above the surface of the substrate, thereby obtaining circuit pattern.

The eighth technology solution of the invention is that, in the fifth solution, step S3 comprises: directly implementing pattern electroplating or panel electroplating on the conductive seed layer formed to the surface of the substrate, thereby obtaining circuit pattern.

The ninth technology solution of the invention is that, in any of the first to the eighth solutions, the substrate is rigid sheet or flexible sheet, rigid sheet comprises one or more of organic polymer rigid plate, ceramic plate, glass plate, wherein organic polymer rigid plate comprises one or more of LCP, PTFE, CTFE, FEP, PPE, synthetic rubber plate, glass fabric/ceramic filler reinforcing plate, flexible sheet is organic polymer thin film, which comprises one or more of PI, PTO, PC, PSU, PES, PPS, PS, PE, PP, PEI, PTFE, PEEK, PA, PET, PEN, LCP or PPA.

The tenth technology solution of the invention is that, in the first or the fifth solutions, during ion implantation, the ions of conductive material gain energy of 1-1000 keV, are implanted below the surface of the substrate and below a hole wall of the hole for a depth of 1-500 nm, and form steady doping structure with the substrate.

The eleventh technology solution of the invention is that, in the second or sixth solution, during plasma deposition, the ions of conductive material gain energy of 1-1000 eV, form a plasma deposition layer in the thickness of 1-10000 nm.

The twelfth technology solution of the invention is that, in any of the first to the eighth solutions, the conductive material composing the conductive seed layer comprises one or more of Ti, Cr, Ni, Cu, Ag, Au, V, Zr, Mo, Nb and alloy thereof.

The thirteenth technology solution of the invention is that, in the third or the seventh solution, via one or more of electroplating, chemical plating, vacuum evaporation, sputtering, utilizing one or more of Al, Mn, Fe, Ti, Cr, Co, Ni, Cu, Ag, Au, V, Zr, Mo, Nb and alloy thereof, to form the conductor thickening layer with a thickness of 0.01-1000 μm.

According to methods for manufacturing single-layer circuit board of the invention, metalization of the substrate surface and metalization of the hole can be conducted simultaneously. Therefore, single-layer circuit board with metalized via hole can be directly achieved on the substrate via one time forming, without needing as prior art that, it need to overlay thick metal foil to the substrate in advance and afterward implement etching thinning to metal foil to drill a hole on the substrate, and it need to further form conductive layer on the hole wall via process of chemical electroless copper or black hole, shadow or the like, to obtain metalized via hole. Compared to prior art, the process procedure of present methods is significantly shorter, and can decrease the using of etching liquid, facilitating protection of the environment. Additionally, via adjusting various process parameter, these methods very easily achieve very thin circuit pattern layer in thickness, the resultant single-layer circuit board can advantageously be applied to medium and high grade precision electronic product on the basis of HDI(high density interconnected base plate) and COF(flexible chip) technology. Additionally, during ion implantation, the ions of conductive material are forcibly implanting inside of the substrate in very high speed, form steady doping structure with the substrate, which corresponds to forming a large number of piles below the substrate surface and the hole wall. because the existing of piles, and subsequently achieved conductive layer (the plasma deposition layer or the conductor thickening layer) is connected with the piles, therefore, the binding force between finally achieved conductive layer of the base plate and the substrate is high, much higher than the binding force between magnetron sputtering achieved metal layer in prior art and the conductor. Also, the dimension of the conductive material ion for ion implantation is usually in nanometer level, distributed relatively uniform during ion implantation, and there is no big difference for incident angle to the substrate surface and the hole wall. Therefore, it can ensure the subsequently formed conductor thickening layer or plasma deposition layer above the ion implantation layer have good uniformity and compactness, without easily occurring pin hole phenomenon. When micro-hole metalization, it is easy to form surface uniform compact conductive seed layer on the hole wall, and the ratio of the conductor layer thickness of the hole wall and the conductor layer thickness of the substrate surface can reach 1:1, therefore when electroplating or the like, problems of hole wall conductor layer being nonuniform and void or crack or the like don't occur, which can effectively improve the conductivity of the metalized hole.

The fourteenth technology solution of the invention is a single-layer circuit board, which comprises substrate and a circuit pattern layer formed to partial surface of the substrate, the substrate is provided with a hole, the hole comprises blind hole and/or through hole, the hole wall of the hole is formed with conductive seed layer, the circuit pattern layer comprises a conductive seed layer substrate formed on partial surface, wherein the conductive seed layer comprises a ion implantation layer implanted below partial surface of the substrate and below the hole wall of the hole.

Because of the existing of ion implantation layer in the hole wall, such single-layer circuit board can have very high binding force between the hole wall and the conductive seed layer, thus the conductive layer of the hole wall wouldn't easily fall off or scuff in the subsequent various fabrication or application process. Therefore, it facilitates improving the conductivity of the hole, facilitating to achieve single-layer circuit board with good connectivity.

The fifteenth technology solution of the invention is that, in the fourteenth solution, the ion implantation layer is located below partial surface of the substrate and below the hole wall of the hole for a depth of 1-500 nm, and form steady doping structure with the substrate.

The sixteenth technology solution of the invention is that, in the fourteenth solution, the conductive seed layer further comprises plasma deposition layer adhered above the ion implantation layer; the plasma deposition layer has a thickness of 1-10000 nm.

The seventeenth technology solution of the invention is that, in the fourteenth solution, conductive seed layer is composed by conductive material, such conductive material comprises one or more of Ti, Cr, Ni, Cu, Ag, Au, V, Zr, Mo, Nb and alloy thereof.

The eighteenth technology solution of the invention is that, in the fourteenth solution, circuit pattern layer further comprises a conductor thickening layer located above the conductive seed layer, the conductor thickening layer has a thickness of 0.01-1000 μm, and is constituted by one or more of Al, Mn, Fe, Ti, Cr, Co, Ni, Cu, Ag, Au, V, Zr, Mo, Nb and alloy thereof.

The nineteenth technology solution of the invention is methods for manufacturing multi-layer circuit board, comprising: implementing laying-up plate and lamination in the order of metal foil, middle sticking layer, single-layer circuit board, middle sticking layer, single-layer circuit board, . . . , middle sticking layer, metal foil(S1); drilling a hole on the multi-layer plate after lamination, the hole comprises through hole and/or blind hole (S2); forming conductive seed layer on the hole wall of the hole (S3); and removing part of the metal foil, to form circuit pattern (S4), wherein step S3 comprises implanting a conductive material below the hole wall of the hole via ion implantation, to form ion implantation layer as at least part of the conductive seed layer.

During ion implantation, the ions of conductive material are forcibly implanted below the hole wall in very high speed, and form steady doping structure with the substrate, which corresponds to forming a large number of piles below the hole wall because the existing of piles, and subsequently achieved conductive layer (plasma deposition layer or conductor thickening layer) is connected with the piles, therefore, the binding force between the finally achieved conductive layer of the base plate and the substrate is high, much higher than the binding force between the achieved metal layer by magnetron sputtering in prior art and the conductor. Also, the dimension of the conductive material ion for ion implantation is usually in nanometer level, distributed relatively uniform during ion implantation, and there is no big difference for incident angle on the hole wall. Therefore, it can ensure the subsequently formed conductor thickening layer or plasma deposition layer above the ion implantation layer have good uniformity and compactness, without easily occurring pin hole phenomenon. When micro-hole metalization, it is easy to form surface uniform compact conductive seed layer on the hole wall, which can effectively improve the conductivity of the metalized hole.

The twentieth technology solution of the invention is methods for manufacturing multi-layer circuit board, comprising: implementing laying-up plate and lamination in the order of surface sticking layer, single-layer circuit board, middle sticking layer, single-layer circuit board, middle sticking layer, single-layer circuit board, . . . , surface sticking layer (S1); drilling a hole on the multi-layer plate after lamination, the hole comprises through hole and/or blind hole (S2); forming a conductive seed layer on the outer surface of the surface sticking layer and the hole wall of the hole (S3); and forming circuit pattern on the outer surface of the surface sticking layer (S4), wherein step S3 comprises, implanting a conductive material below the outer surface of the surface sticking layer and below the hole wall of the hole via ion implantation, to form ion implantation layer as at least part of the conductive seed layer.

According to such methods, the metalization of the outer surface of the surface sticking layer and metalization of the hole can be simultaneously implemented. Therefore, multi-layer circuit board with metalized via hole and surface circuit pattern can be directly achieved via one time forming, without needing as prior art that, it need to overlay thick metal foil in advance and afterward implement etching thinning to metal foil to drill a hole, and it need to further form conductive layer on the hole wall via process of chemical electroless copper or black hole, shadow or the like, to obtain metalized via hole. Compared to prior art, the process procedure of present methods is significantly shorter, and can decrease the using of etching liquid, facilitating protection of the environment. Additionally, via adjusting various process parameter, these methods very easily achieve very thin circuit pattern layer in thickness, the resultant single-layer circuit board can advantageously be applied to medium and high grade precision electronic product on the basis of HDI(high density interconnected base plate) and COF(flexible chip) technology.

The twenty-first technology solution of the invention is that, in the nineteenth or the twentieth solution, during ion implantation, the ions of conductive material gain energy of 1-1000 keV, are implanted below the hole wall of the hole and/or below the outer surface of the surface sticking layer for a depth of 1-500 nm, and form steady doping structure with the substrate.

The twenty-second technology solution of the invention is that, in the nineteenth or the twentieth solution, step S3 further comprises, depositing a conductive material above the ion implantation layer via plasma deposition, to form plasma deposition layer, the plasma deposition layer and the ion implantation layer constitute the conductive seed layer.

The twenty-third technology solution of the invention is that, in the twenty-second solution, during plasma deposition, the ions of conductive material gain energy of 1-1000 eV, form the plasma deposition layer in a thickness of 1-10000 nm.

The twenty-fourth technology solution of the invention is that, in the nineteenth or the twentieth solution, the conductive material composing the conductive seed layer comprises one or more of Ti, Cr, Ni, Cu, Ag, Au, V, Zr, Mo, Nb and alloy thereof.

The twenty-fifth technology solution of the invention is that, in the nineteenth solution, step S3 further comprises: forming a conductor thickening layer on the conductive seed layer formed on the hole wall.

The twenty-sixth technology solution of the invention is that, in the nineteenth or the twentieth solution, step S4 comprises: first form a conductor thickening layer on the conductive seed layer, then implementing pattern electroplating or panel electroplating on the conductor thickening layer located above the outer surface of the surface sticking layer, thereby obtaining circuit pattern.

The twenty-seventh technology solution of the invention is that, in the twenty-fifth or the twenty-sixth solution, via one or more of electroplating, chemical plating, vacuum evaporation, sputtering, utilizing one or more of Al, Mn, Fe, Ti, Cr, Co, Ni, Cu, Ag, Au, V, Zr, Mo, Nb and alloy thereof, to form the conductor thickening layer with a thickness of 0.01-1000 μm.

The twenty-eighth technology solution of the invention is that, in the twentieth solution, step S4 comprises: implementing pattern electroplating or panel electroplating directly on the conductive seed layer formed on the outer surface of the surface sticking layer, thereby obtaining circuit pattern.

The twenty-ninth technology solution of the invention is that, in the nineteenth or the twentieth solution, at least one of the middle sticking layer is provided with a hole, the hole wall of such hole is formed with conductive layer.

The thirtieth technology solution of the invention is that, in the nineteenth or the twentieth solution, at least one of the single-layer circuit board is provided with hole, the hole wall of such hole is formed with conductive layer.

The thirty-first technology solution of the invention is that, in the nineteenth or the twentieth solution, the middle sticking layer and/or the surface sticking layer comprises one or more of PP, PI, PTO, PC, PSU, PES, PPS, PS, PE, PEI, PTFE, PEEK, PA, PET, PEN, LCP, PPA.

The thirty-second technology solution of the invention is multi-layer circuit board, which is successively constituted by metal foil, middle sticking layer, single-layer circuit board, middle sticking layer, single-layer circuit board, , middle sticking layer, metal foil, the multi-layer circuit board is provided with a hole, the hole wall of the hole is formed with a conductive seed layer, and partial region of the metal foil is removed to form circuit pattern layer, wherein the conductive seed layer comprises the ion implantation layer implanted below the hole wall of the hole.

The thirty-third technology solution of the invention is multi-layer circuit board, which is successively constituted by surface sticking layer, single-layer circuit board, middle sticking layer, single-layer circuit board, . . . , surface sticking layer, multi-layer circuit board is provided with hole, the hole wall of the hole is formed with a conductive seed layer, and partial outer surface of the surface sticking layer is formed with a circuit pattern layer of conductive seed layer, wherein the conductive seed layer comprises the ion implantation layer implanted below the hole wall of the hole and below partial outer surface of the surface sticking layer.

Because of the existing of ion implantation layer in the hole wall, such multi-layer circuit board can have very high binding force between the hole wall and the conductive seed layer, thus the conductive layer of the hole wall wouldn't easily fall off or scuff in the subsequent various fabrication or application process. Therefore, it facilitates improveing the conductivity of the hole, facilitating achieving multi-layer circuit board with good connectivity.

The thirty-fourth technology solution of the invention is that, in the thirty-second or the thirty-third solution, the ion implantation layer is located below the hole wall of the hole and/or below partial outer surface of the surface sticking layer for a depth of 1-500 nm, and form steady doping structure with the substrate.

The thirty-fourth technology solution of the invention is that, in the thirty-second or the thirty-third solution, conductive seed layer further comprises a plasma deposition layer adhered above the ion implantation layer, such plasma deposition layer has a thickness of 1-10000 nm.

The thirty-fourth technology solution of the invention is that, in the thirty-second or the thirty-third solution, the conductive seed layer is composed by a conductive material, such conductive material comprises one or more of Ti, Cr, Ni, Cu, Ag, Au, V, Zr, Mo, Nb and alloy thereof.

The thirty-fourth technology solution of the invention is that, in the thirty-second or the thirty-third solution, a conductor thickening layer with a thickness of 0.01-1000 μm is formed above the conductive seed layer.

The thirty-fourth technology solution of the invention is that, in the thirty-second or the thirty-third solution, the hole is a through hole throughout the multi-layer circuit board, a blind hole formed on the multi-layer surface of the circuit board, or a blind hole formed in the single-layer circuit board or the middle sticking layer.

The thirty-fourth technology solution of the invention is that, in the thirty-second or the thirty-third solution, the middle sticking layer and/or the surface sticking layer comprises one or more of PP, PI, PTO, PC, PSU, PES, PPS, PS, PE, PEI, PTFE, PEEK, PA, PET, PEN, LCP, PPA.

BRIEF DESCRIPTION OF THE DEAWINGS

These and other features, aspects, and advantages of the present invention will become better understood by one skilled in the art when the following detailed description is read with reference to the accompanying drawings. For clarity, the drawings is not necessarily to the scale, rather some portion therein might be exaggerated to illustrate details. The same characters represent the same or like parts throughout the drawings, wherein.

Figure 1:
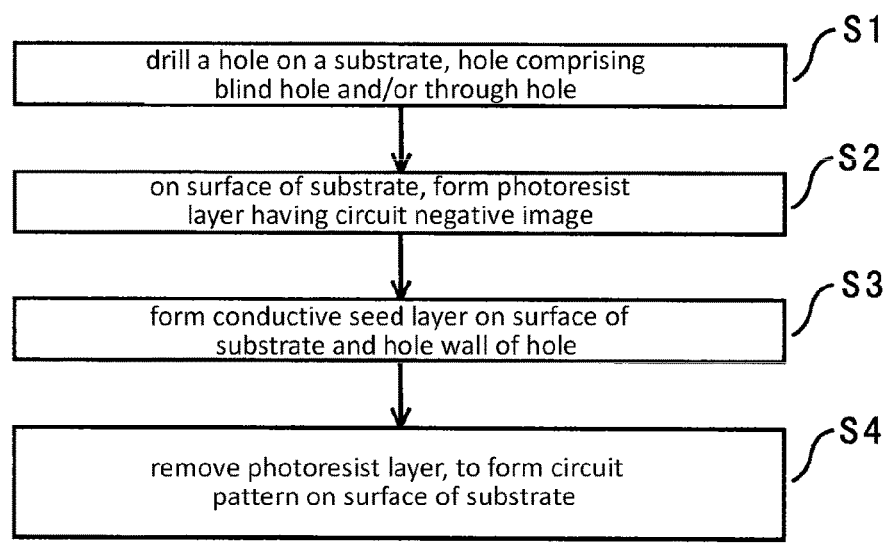
FIG. 1 represents flowchart of methods for manufacturing single-layer circuit board according to the first embodiment of the invention.

REFERENCE NUMBER:

10 single-layer circuit board
11 substrate
12 surface of the substrate
13 conductive seed layer
131 ion implantation layer
132 plasma deposition layer
15 conductor thickening layer
16 circuit pattern layer
161 circuit region
162 no-circuit region
17 through hole
18 blind hole
19 hole wall
20 multi-layer circuit board
21 metal foil
22 middle sticking layer
23 surface sticking layer
24 photoresist film.

DETAILED DESCRIPTION

In the following, with reference to the drawings, the implementation of the invention is described in detail. It should be understood by one skilled in the art; this description only exemplifies example embodiments of the invention, but by no means limits the scope of the invention.

Figure 2:
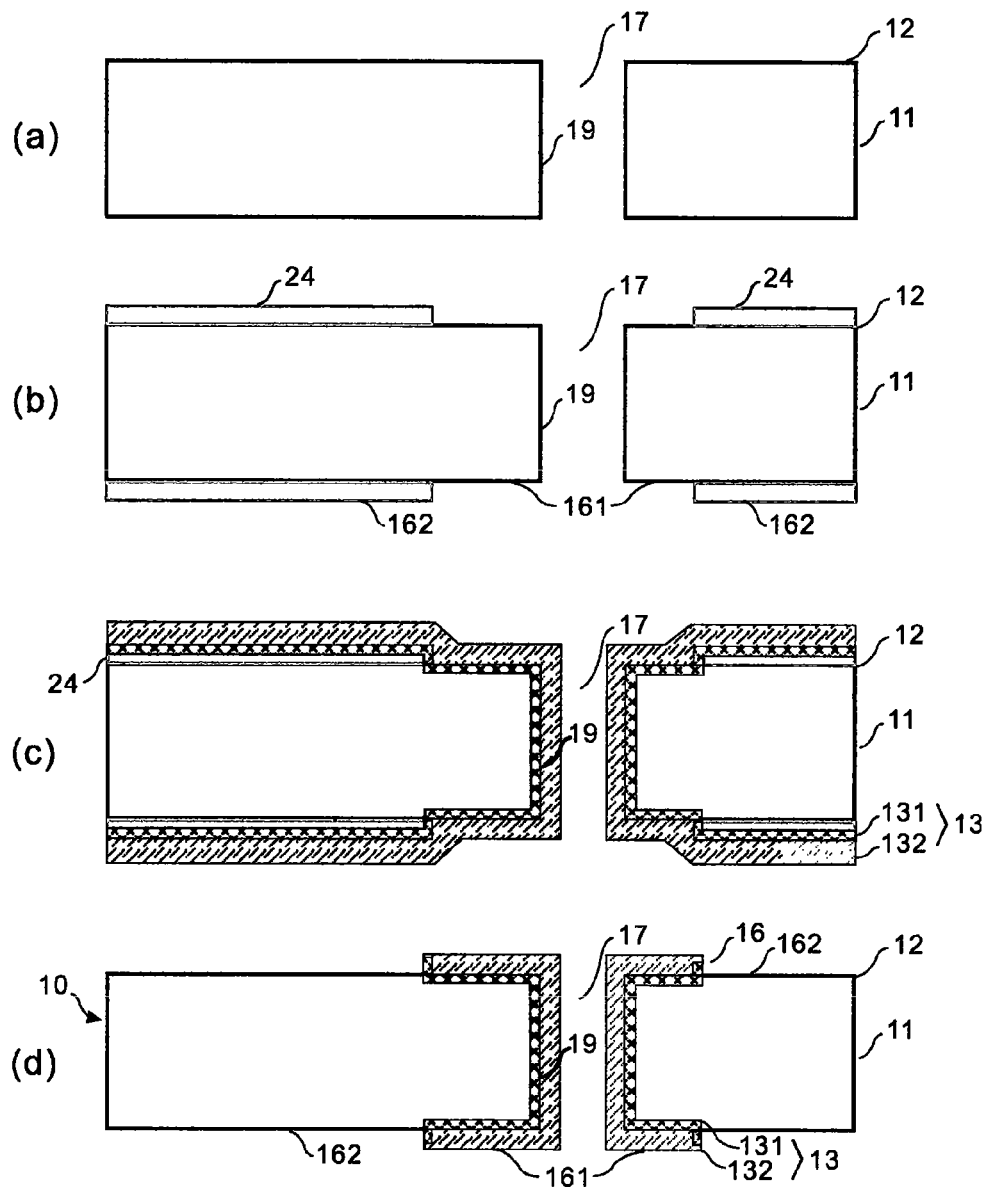
FIG. 2 represents sectional schematic view of respective product of each step of the methods shown in FIG. 1.

FIG. 1 represents flowchart of methods for manufacturing single-layer circuit board according to the first embodiment of the invention, while FIG. 2 represents sectional schematic view of respective product of each step of the methods shown in FIG. 1. As shown in FIG. 1, such methods comprises the following steps: drilling a hole on a substrate, the hole comprises blind hole and/or through hole (S1); forming a photoresist layer having circuit negative image on the surface of the substrate (S2); forming a conductive seed layer on the surface of substrate and a hole wall of the hole (S3); and removing photoresist layer, to form circuit pattern on the surface of the substrate (S4). FIG. 2 (*a*), (*b*), (*c*) and (*d*) correspond to step S1, S2, S3 and S4 respectively. Reference is made to FIG. 1 and FIG. 2 simultaneously in the following, each step of such methods is illustrated in detail.

In the manufacturing process of circuit board, usually using insulated material as substrate, overlaying composite metal material on single-face or double-face of such substrate and implementing etching thereof, thereby achieving circuit board. As an example of insulated substrate, it can use rigid substrate (also known as hard plate), for example one or more of organic polymer rigid plate, ceramic plate (such as silicon dioxide plate), glass plate or the like, the organic polymer rigid plate can further comprises one or more of LCP, PTFE, CTFE, FEP, PPE, synthetic rubber plate, glass fabric/ceramic filler reinforcing plate, wherein glass fabric/ceramic filler reinforcing plate is sheet with organic polymer material such as epoxy resin, modified epoxy resin, PTFE, PPO, CE, BT or the like as base material, with glass fabric/ceramic filler as reinforcing phase. Additionally, insulated substrate can also use flexible plate (also known as soft plate), for example organic polymer thin film, which comprises one or more of PI, PTO, PC, PSU, PES, PPS, PS, PE, PP, PEI, PTFE, PEEK, PA, PET, PEN, LCP or PPA.

First, there is need to drill a hole on a substrate (step S1). Although only through hole 17 is shown in FIG. 2(*a*), but it can also drilling a blind hole on the surface 12 of the substrate 11. Through hole is the hole penetrating surface and blackface of the substrate, while blind hole is the hole penetrating inside the substrate but not penetrating such substrate. The shape of hole can be various shape of circle, rectangle, triangle, diamond, stepwise or the like. Drilling the hole can be conducted utilizing mechanical drilling, punching, laser drilling, plasma etching and reactive ion etching or the like, wherein laser drilling can further comprises infrared laser drilling, YAG laser drilling and ultraviolet laser drilling, a micro-hole with diameter of 2-5 μm can be formed on the substrate. To decrease heat impacted region, preventing edge of the hole from heat damage, preferably ultraviolet laser drilling is utilized. In the case of manufacturing flexible circuit board in a roll-to-roll manner, continuously drilling manner can be utilized to form a series of holes on a roll of flexible plate substrate. After forming a hole on the substrate, it need to clean void, to clear away impurities of drilling bits or the like existing therein.

Subsequently, forming a photoresist layer having circuit negative image on the surface of the substrate (step S2). In particular, as shown in FIG. 2(*b*), painting or sticking a layer of photoresist film 24 on the surface 12 of the substrate 11 after drilling a hole and cleaning, placing the substrate overlaid with photoresist film 24 on a lithography machine to implement exposure and development, after washing the substrate surface and baking, obtaining a photoresist layer having circuit negative image (i.e. forming complementing image of the circuit pattern to be finally formed on the substrate surface). At the time, photoresist film 24 only exists in the no-circuit region 162 on the substrate surface, while such photoresist film 24 doesn't exist in the complementary circuit region 161 thereof.

Then, forming a conductive seed layer on the surface of substrate and a hole wall of the hole (step S3). Because photoresist film 24 is formed in the no-circuit region 162 of the substrate surface 12, thus in such process, conductive seed layer 13 will also form on the surface of the photoresist film 24. It is important that, step S3 comprises implanting a conductive material below the surface 12 of the substrate 11 and the below the hole wall of the hole 19 via ion implantation, to form ion implantation layer 131, as at least part of the conductive seed layer 13. It should be noted, "implanting below the hole wall" described in the text actually refers to implanting below the substrate surface at the hole wall (i.e., wall surface of the hole). for example, in FIG. 2(*c*), ion implantation layer 131 is implanted below the hole wall 19 of the hole 17, actually refers to ion implantation layer 131 is located below the substrate surface at the hole wall 19 of the hole 17 (i.e., wall surface of the hole).

the forming of ion implantation layer can be achieved via the following methods: using conductive material as target material, in ion implantation equipment in vacuum environment, ionizing the conductive material in the target material via arcing to generate ion, then accelerating such ion in the electric field with high voltage to gain very high energy, for example 1-1000 keV. Conductive material ion with high energy subsequently directly strikes on the surface of the substrate and the hole wall of the hole in very high speed, and implants below the substrate surface and the hole wall for certain depth, for example 1-500 nm. Steady doping structure is formed between the implanted conductive material ion and the material constituting the substrate, as doping structure in semiconductor. The outer surface of such doping structure (i.e., ion implantation layer) is flush with the substrate surface or the hole wall, while inner surface thereof penetrates inside of the substrate. As a particular example, the ions of conductive material can gain energy of 50 keV, 100 keV, 200 keV, 300 keV, 400 keV, 500 keV, 600 keV, 700 keV, 800 keV, 900 keV during ion implantation, and can be implanted below the substrate surface and the hole wall for a depth in the range of 10 nm, 20 nm, 50 nm, 100 nm, 200 nm, 300 nm, 400 nm.

Various metal, alloy, conductive oxides, conductive carbide, conductive organics or the like can be used as conductive material used by ion implantation, but it is not so limited. Preferably, metal or alloy with strong binding force with substrate molecule is used to implement ion implantation, comprising one or more of Ti, Cr, Ni, Cu, Ag, Au, V, Zr, Mo, Nb and alloy thereof, such alloy for example is NiCr, TiCr, VCr, CuCr, MoV, NiCrV, TiNiCrNb or the like. Also, ion implantation layer can comprise one layer or multi-layer. Before ion implantation, pre-treatment of decontamination, surface cleaning, sealant treatment, Hall source treatment in vacuum environment, surface deposition treatment or the like can be conducted to substrate with hole.

During ion implantation, the ions of conductive material are forcibly implanted inside of the substrate in very high speed, form steady doping structure with the substrate, this corresponds to forming a large number of piles below the substrate surface and the hole wall. because the existing of piles, and subsequently achieved metal layer (plasma deposition layer or conductor thickening layer) is connected with the piles, therefore, the stripping strength between the substrate and the metal layer subsequently formed thereon can reach above 0.5N/mm, for example between 0.7-1.5N/mm, more specifically between 0.8-1.2N/mm. Compared to that, in conventional magnetron sputtering circumstance, the highest energy of sputtering particle is only several electronic volts, thus such particle will only deposit on the substrate surface and hole wall but will not enter inside of the substrate, binding force between the resultant sputtering deposition layer and substrate surface and hole wall is not high, at most only about 0.5N/mm, which is obviously lower than the invention. Also, the dimension of the conductive material ion for ion implantation is usually in nanometer level, are distributed relatively uniform during ion implantation, and there is no big difference for incident angle to the substrate surface and the hole wall. Therefore, it can ensure the subsequently formed conductor thickening layer or plasma deposition layer above the ion implantation layer have good uniformity and compactness, without easily occurring pin hole phenomenon. Also, when micro-hole metalization, it is easy to form surface uniform compact conductive seed layer on the hole wall, and the ratio of the conductor layer thickness of the hole wall and the conductor layer thickness of the substrate surface can reach 1:1, therefore when subsequently electroplating or the like, problems of hole wall conductor layer being nonuniform and void or crack or the like don't occur, which can effectively improve the conductivity of the metalized hole.

In addition to ion implantation, step S3 can also comprise depositing a conductive material above the ion implantation layer via plasma deposition, to form a plasma deposition layer, such plasma deposition layer and the ion implantation layer constitute the conductive seed layer together. As shown in FIG. 2(c), through step S3, ion implantation layer 131 is formed each below the hole wall 19 of the through hole 17, below the substrate surface 12 in circuit region 161, and below the surface of the photoresist film 24 in no-circuit region 162, and plasma deposition layer 132 is formed on such ion implantation layer 131. of course, step S3 can also not comprise plasma deposition, at the time, the plasma deposition layer 132 shown in FIG. 2(c) doesn't exist, while only ion implantation layer 131 exists.

plasma deposition can be conducted in ion implantation equipment utilizing similar manner with ion implantation described above, but that lower voltage is applied to make the conductive material ion have lower energy. I.e., using conductive material as target material, in vacuum environment, ionizing the conductive material in the target material via arcing to generate ion, then accelerating such ions in electric field to gain certain energy, for example 1-1000 eV. The conductive material ions after accelerating fly to the substrate surface and the hole wall and deposit to the ion implantation layer substrate formed below the surface and the hole wall, composing plasma deposition layer in a thickness of 1-10000 nm. As a particular example, conductive material ion can gain energy of 50 eV, 100 eV, 200 eV, 300 eV, 400 eV, 500 eV, 600 eV, 700 eV, 800 eV, 900 eV during plasma deposition, and form plasma deposition layer in a thickness of 100 nm, 200 nm, 500 nm, 700 nm, 1 µm, 2 µm, 5 µm, 7 µm or 10 µm. In the circumstance that the plasma deposition layer is thick, the through hole or blind hole drilled in the substrate might be filled fully. That is to say, all the hole is filled by conductive material, macroscopically there is no hole structure existing.

In plasma deposition, conductive materials same or different as ion implantation can be used as target material. Additionally, conductive material can be selected according to the selected substrate, and the constituting component and thickness of the ion implantation layer or the like. Preferably, metal or alloy with good binding ability with the ion implantation layer can be used to implement plasma deposition, for example one or more of Ti, Cr, Ni, Cu, Ag, Au, V, Zr, Mo, Nb and alloy thereof can be used, such alloy for example is NiCr, TiCr, VCr, CuCr, MoV, NiCrV, TiNiCrNb or the like. Also, plasma deposition layer also can comprise one layer or multi-layer.

During plasma deposition, the conductive material ions fly to the substrate surface and the hole wall in relatively high speed, and deposited to the ion implantation layer formed on the substrate surface and below the hole wall, form relatively large binding force with the conductive material in the ion implantation layer, thus not easily fall off from the substrate surface and the hole wall. Additionally, the dimension of the conductive material ion for ion implantation is usually in nanometer level, distributed relatively uniform during ion implantation, and there is no big difference for incident angle to the substrate surface and the hole wall. Therefore, it can ensure the resultant plasma deposition layer or the conductor thickening layer subsequently formed on it have good uniformity and compactness, without easily occurring pin hole phenomenon. Additionally, the thickness of the ion implantation layer is usually thin, with bad conductivity, while the plasma deposition layer can improve the conductivity of the conductive seed layer, thereby improving the performance of the resultant circuit board.

After forming conductive seed layer, the photoresist layer can be removed, to form circuit pattern on the surface of the substrate (step S4). As shown in FIG. 2(d), the photoresist film 24 existing in no-circuit region 162 is removed, the conductive seed layer 13 formed on such photoresist film 24 is also removed together, while only the conductive seed layer 13 in the circuit region 161 located on the hole wall 19 and the substrate surface 12 is left. That is to say, on the surface of the substrate 12, conductive seed layer 13 only exists in the circuit region 161, thereby achieving a double-face single-layer circuit board 10 having circuit pattern. In preferable embodiment, stripping liquid can be used to dissolve photoresist layer, for example, substrate formed with photoresist layer with circuit negative image and conductive seed layer can be placed into proper stripping liquid, and is stirred or shocked to accelerate the dissolving of the photoresist layer, after the photoresist layer fully dissolves, using detergent to implement thorough washing and subsequently baking. Wherein stripping liquid can be organic solvent or alkali liquid or the like that can dissolve photoresist layer.

As shown in FIG. 2(d), single-layer circuit board 10 achieved via above-mentioned methods comprises substrate 11 and circuit pattern layer 16 formed on partial surface of the substrate, the substrate 11 is provided with a hole, the conductive seed layer 13 is formed on the hole wall of such hole 19, and circuit pattern layer 16 also comprises the conductive seed layer 13 form on partial surface of the substrate 11, the conductive seed layer 13 comprises the ion implantation layer 131 implanted below the surface of the substrate 12 and below the hole wall of the hole 19, and the plasma deposition layer 132 adhered on such ion implantation layer 131. Of course, when step S3 doesn't comprise plasma deposition, the conductive seed layer 13 is only constituted by ion implantation layer 131.

Alternatively, after step S3, before step S4, methods shown in FIG. 1 can also comprises, form a conductor thickening layer on the conductive seed layer, to improve the conductivity thereof. In particular, via one or more of methods of electroplating, chemical plating, vacuum evaporation, sputtering or the like, utilizing one or more of Al, Mn, Fe, Ti, Cr, Co, Ni, Cu, Ag, Au, V, Zr, Mo, Nb and alloy thereof, the conductor thickening layer in a thickness of 0.01-1000 μm (for example 0.5 μm, 1 μm, 5 μm, 10 μm, 50 μm, 100 μm or the like) can be formed. It is easily understood that, in the circumstance of substrate formed with through hole or blind hole, such through hole or blind hole might be filled fully by the conductor thickening layer, i.e., macroscopically there is no hole structure existing. Electroplating is most common and most preferable, because for electroplating, the speed is fast, the cost is low, and the material range that can be electroplated is very wide, it can used for various conductive material of Cu, Ni, Sn, Ag and alloy of them or the like. For certain conductive material, especially metal and alloy (for example Al, Cu, Ag and alloy thereof), sputtering speed can reach 100 nm/min, thus sputtering manner can be used to fast coat a conductor layer on the conductive seed layer. because previously uniform compact conductive seed layer is already formed via ion implantation and/or plasma deposition on the surface of the substrate and the hole wall, so uniform compact conductor thickening layer is easily formed via above-mentioned various methods on such conductive seed layer.

In the circumstance of forming with a conductor thickening layer, such conductor thickening layer will respectively covers the conductive seed layer, and finally exists on the conductive seed layer in circuit region after the photoresist layer is removed, as part of surface circuit pattern of the circuit board. In FIG. 2, the conductive seed layer 13 is constituted by ion implantation layer 131 and plasma deposition layer 132, thus the conductor thickening layer is adhered on the plasma deposition layer. It is easily understood that, in the circumstance that the conductive seed layer only comprises ion implantation layer, the conductor thickening layer is directly adhered on such ion implantation layer.

According to above-mentioned methods, metalized hole can be formed on a substrate and circuit pattern can be formed on the surface of such substrate via simple process procedure. When forming circuit pattern, because before forming conductive seed layer, photoresist film is overlaid in advance on the substrate surface and further forming a photoresist layer with circuit negative image, afterward using stripping liquid to dissolve such photoresist layer to make the conductive seed layer and/or conductor thickening layer in non-circuit region fall off together with photoresist layer, so there is no need to obtain circuit pattern via etching as prior art, or at least the using of etching liquid can decrease, thereby decreasing or eliminating the harm to the environment by etching waste water containing metal ion.

Figure 3:
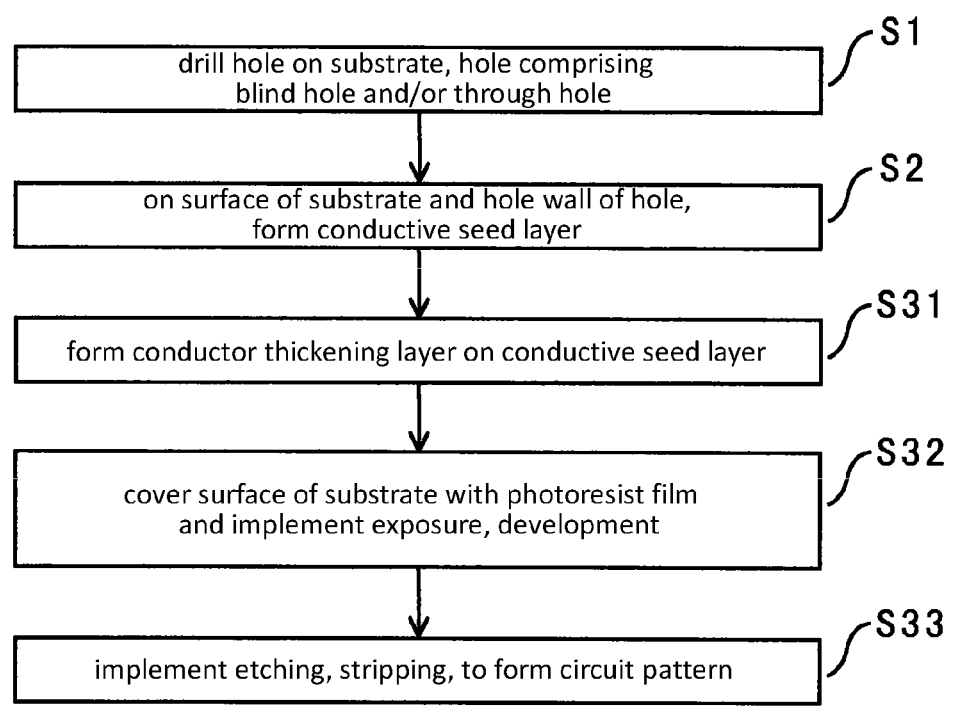
FIG. 3 represents flowchart of methods for manufacturing single-layer circuit board according to the second embodiment of the invention.
Figure 4:
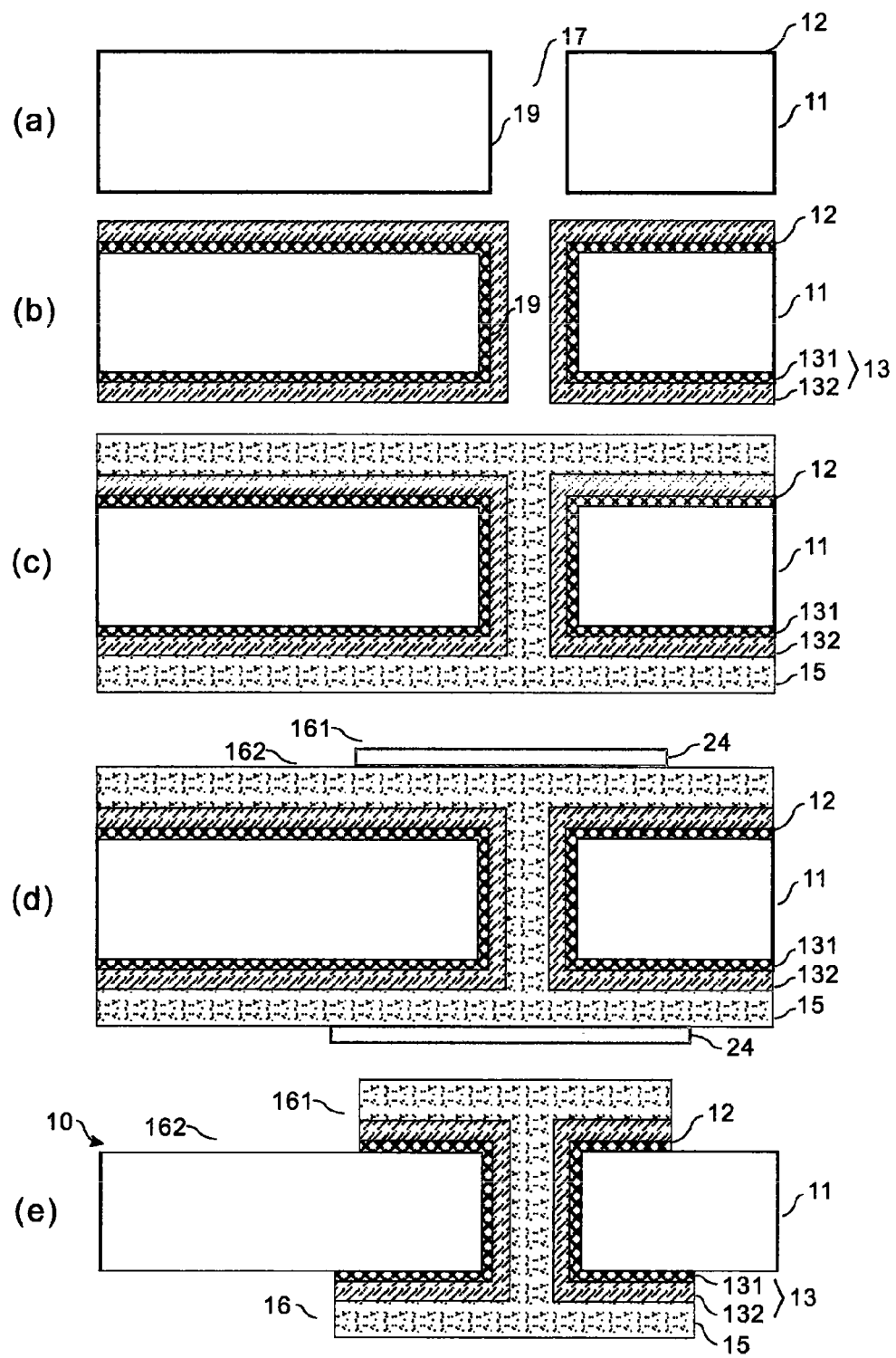
FIG. 4 represents sectional schematic view of respective product of each step of the methods shown in FIG. 3.

FIG. 3 represents flowchart of methods for manufacturing single-layer circuit board according to the second embodiment of the invention, while FIG. 4 represents sectional schematic view of respective product of each step of the methods shown in FIG. 3. As shown in FIG. 3, such methods comprises the following steps: drilling a hole on a substrate, the hole comprises blind hole and/or through hole (S1); forming a conductive seed layer on the surface of substrate and a hole wall of the hole (S2); forming a conductor thickening layer on the conductive seed layer(S31); covering the surface of the substrate with a photoresist film and implementing exposure, development (S32); and implementing etching, stripping, to form circuit pattern (S33). Wherein step S31 to S33 each are steps of forming circuit pattern on the surface of the substrate, in the circumstance of utilizing electroplating to form the conductor thickening layer, these steps can all be known as "panel electroplating".

FIGS. 4(a), (b), (c), (d) and (e) respectively corresponds to above-mentioned step S1, S2, S31, S32 and S33.

In the methods of present embodiment, step S1, S2 respectively corresponds to step S1, S3 shown in methods in FIG. 1, it can be conducted utilizing various methods above described for FIG. 1. Additionally, step S31 can also be conducted utilizing methods described above, i.e. via electroplating, chemical plating, vacuum evaporation, sputtering or the like, utilizing one or more of Al, Mn, Fe, Ti, Cr, Co, Ni, Cu, Ag, Au, V, Zr, Mo, Nb and alloy thereof, forming the conductor thickening layer with a thickness of 0.01-1000 μm on the conductive seed layer. Via step S1, S2 and S31, conductive seed layer is each formed on the surface of substrate and a hole wall of the hole, and conductor thickening layer is formed on such conductive seed layer. In the example shown in FIG. 4(c), the conductive seed layer 13 comprises the ion implantation layer 131 formed below the surface 12 of the substrate 11 and below the hole wall of the hole 19, and the plasma deposition layer 132 adhered on such ion implantation layer 131, while the conductor thickening layer 15 is further adhered on the plasma deposition layer 132, and such conductor thickening layer 15 fills fully throughout the through hole 17 of the substrate 11. It is easily understood that, in the circumstance that step S2 only comprises ion implantation but doesn't comprise plasma deposition, the conductor thickening layer 15 is directly adhered on the ion implantation layer 131.

After forming conductor thickening layer, covering the surface of the substrate with a photoresist film and implementing exposure, development (step S32). In particular, as shown in FIG. 4(d), painting or sticking one layer photoresist film 24 on the substrate surface 12 formed with conductor thickening layer 15, placing the substrate overlaid with photoresist film 24 on a lithography machine to implement exposure and development, after washing the substrate surface and baking, obtaining a photoresist layer having circuit positive image (i.e. forming the same image of the circuit pattern to be finally formed on the substrate surface). At the time, photoresist film 24 only exists in circuit region 161 on the substrate surface, and the complementary no-circuit region 162 thereof doesn't comprise such photoresist film 24.

Then, conventional etching methods can be utilized to remove the conductive seed layer and the conductor thickening layer not covered by photoresist film, subsequently stripping photoresist film (step S33), thereby the conductive seed layer and the conductor thickening layer is only left in the circuit region on the substrate surface, forming surface circuit pattern. As shown in FIG. 4(e), the single-layer circuit board 10 achieved via above-mentioned methods comprises substrate 11 and pattern layer 16 formed on partial surface of the substrate circuit, the substrate 11 is provided with a hole, a conductive seed layer 13 and conductor thickening layer 15 are formed on the hole wall of such hole 19, and circuit pattern layer 16 also comprises conductive seed layer 13 and conductor thickening layer 15, wherein the conductive seed layer 13 comprises the ion implantation layer 131 implanted below the surface of the substrate 12 and below a hole wall of the hole 19, and the plasma deposition layer 132 adhered on such ion implantation layer 131. Of course, in the circumstance that step S2 doesn't comprise plasma deposition; the conductive seed layer 13 is only constituted by ion implantation layer 131.

Figure 5:
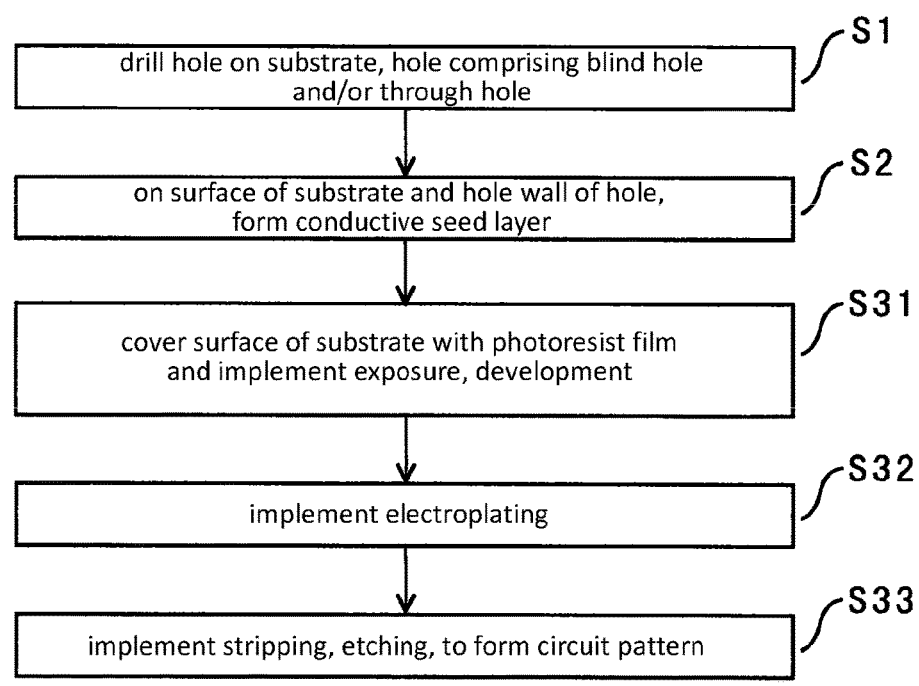
FIG. 5 represents flowchart of methods for manufacturing single-layer circuit board according to the third embodiment of the invention.
Figure 6:
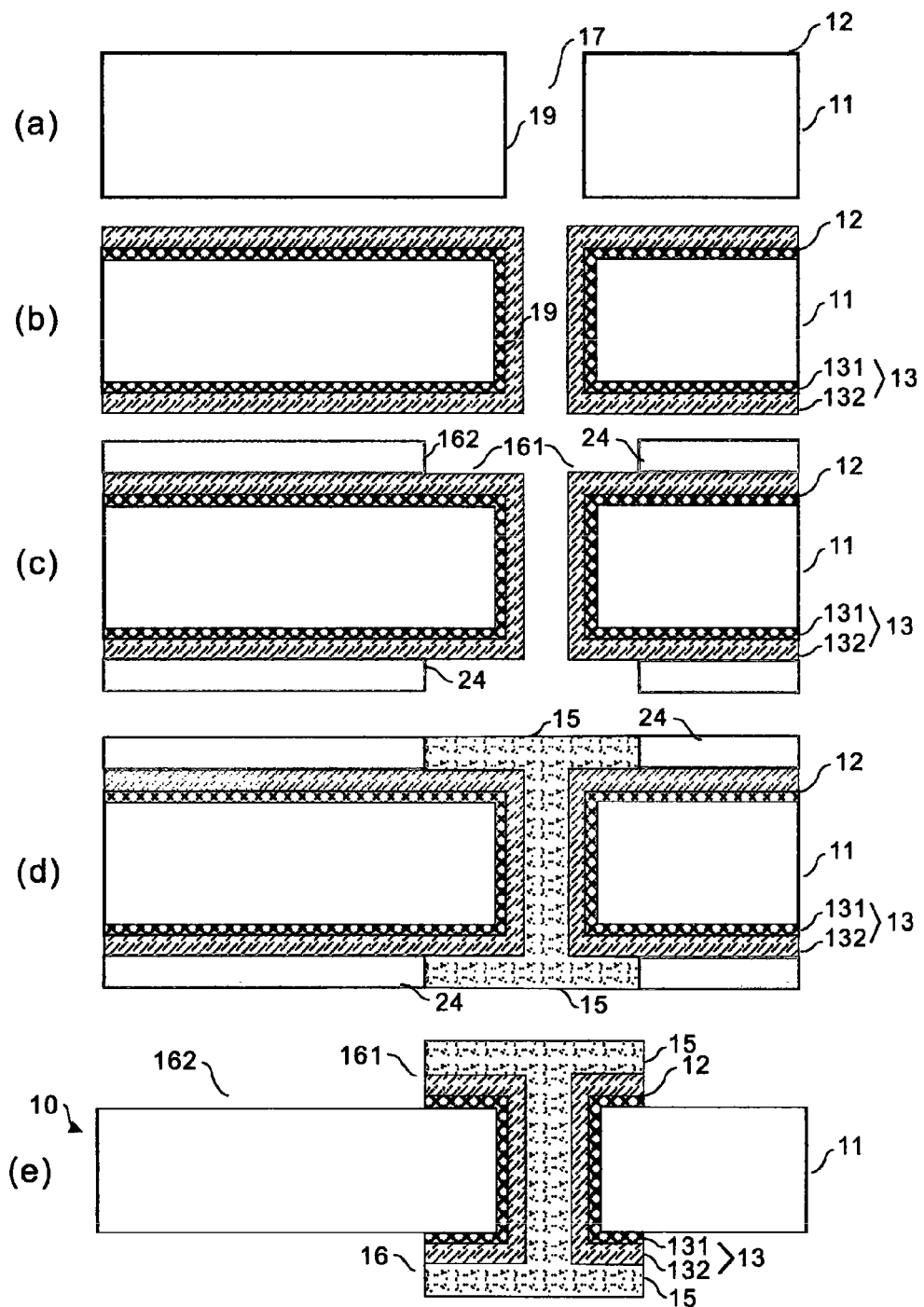
FIG. 6 represents sectional schematic view of respective product of each step of the methods shown in FIG. 5.

FIG. 5 represents flowchart of methods for manufacturing single-layer circuit board according to the third embodiment of the invention, while FIG. 6 represents sectional schematic view of respective product of each step of the methods shown in FIG. 5. As shown in FIG. 5, such methods comprise the following steps: drilling a hole on a substrate, the hole comprises blind hole and/or through hole (S1); forming a conductive seed layer on the surface of substrate and a hole wall of the hole (S2); covering the surface of the substrate with a photoresist film and implementing exposure, development (S31); implementing electroplating (S32); and implementing stripping, etching, to form circuit pattern (S33).

Wherein step S31 to S33 each are steps to form circuit pattern on the surface of the substrate, generally known as "pattern electroplating". Compared to the methods shown in FIG. 3, the difference of the methods of present embodiment is that, pattern electroplating is utilized rather than panel electroplating to form circuit pattern. FIG. 6 (a), (b), (c), (d) and (e) respectively corresponds to above-mentioned step S1, S2, S31, S32 and S33.

In the methods of present embodiment, step S1, S2 respectively corresponds to step S1, S2 in the methods shown in FIG. 3, it can be conducted utilizing various methods above described for FIG. 3. After step S2, the surface of the substrate and the hole wall of the hole each are formed with conductive seed layer. As shown in FIG. 6(b), the conductive seed layer 13 comprises the ion implantation layer 131 formed below the surface 12 of the substrate 11 and below the hole wall of the hole 19, and the plasma deposition layer 132 adhered on such ion implantation layer 131. It is easily understood that, in the circumstance that step S2 only comprises ion implantation but doesn't comprise plasma deposition, the plasma deposition layer 132 doesn't exist. Additionally, step S31 can also conducted utilizing similar manner with step S32 in the methods shown in FIG. 3, i.e., covering the substrate surface formed with conductive seed layer with a photoresist film and implementing exposure, development. In particular, as shown in FIG. 6(c), painting or sticking one layer photoresist film 24 on the substrate surface 12 formed with conductive seed layer 13, placing the substrate overlaid with photoresist film 24 on a lithography machine to implement exposure and development, after washing substrate surface and baking, obtaining photoresist layer having circuit negative image. At the time, the photoresist film 24 only exists in the no-circuit region 162 on the substrate surface, and the complementing circuit region 161 thereof doesn't comprise photoresist film 24.

Subsequently, there is need to implement electroplating (step S32). Because the photoresist layer is insulated, thus in electroplating process, the conductor thickening layer doesn't form above the photoresist layer, but rather only form above the conductive seed layer not covered by photoresist layer. At the time, below the photoresist layer, there exists conductive seed layer constituted by the ion implantation layer and the plasma deposition layer, but above the photoresist layer, there doesn't comprise conductor thickening layer. As shown in FIG. 6(d), via electroplating, conductor thickening layer 15 is only formed on the conductive seed layer 13, and such conductor thickening layer 15 fills fully through hole 17. Of course, in the circumstance that the diameter of the through hole 17 is big enough, such through hole 17 will not be filled fully by the conductor thickening layer 15.

Then, there is need to implement stripping, etching, to form circuit pattern (step S33), thereby achieving single-layer circuit board. The single-layer circuit board 10 shown in FIG. 6(e) has the same configuration with the single-layer circuit board 10 shown in FIG. 4(e).

Stripping is stripping photoresist layer having circuit negative image, it can be conducted via steps as following: placing the insulated substrate formed with the conductive seed layer, the photoresist layer and the conductor thickening layer in a proper stripping liquid (for example, organic solvent or alkali liquid or the like that can dissolve the photoresist layer), and is stirred or shocked to accelerate the dissolving of the photoresist layer, afterward implementing washing and baking. Thereby, there are conductive seed layer and conductor thickening layer in the circuit region on the substrate surface, while there is only conductive seed layer in the no-circuit region. Then, fast etching can be conducted to all the surface of the metal base plate, to remove the conductive seed layer in the no-circuit region, obtaining final circuit pattern on the substrate surface. At the time, the conductor thickening layer in the circuit region will also be etched certain thickness corresponding to the conductive seed layer, but it doesn't affect its subsequent usage. Alternatively, it also can be that, after the photoresist layer fully dissolves, overlaying one layer protection layer (for example tin) above the conductor thickening layer located in the circuit region, afterward implementing etching to remove the conductive seed layer located in the no-circuit region, thereby obtaining final circuit pattern. At the time, the conductor thickening layer in the circuit region will not be etched, thereby maintaining good surface property of the conductor thickening layer. Additionally, it also can be that, before placing the substrate in the stripping liquid (i.e., before the photoresist layer dissolves), overlaying one layer protection layer (for example tin) above the conductor thickening layer located in the circuit region, subsequently successively implementing dissolving of the photoresist layer and etching removing of the conductive seed layer in the no-circuit region, obtaining final circuit pattern on the substrate surface. Of course, in the circumstance that protection layer is utilized, it also need to remove such protection layer before gaining final circuit pattern, for example it need to take the step of stripping tin film.

According to methods for manufacturing single-layer circuit board described above, metalization of the substrate surface and metalization of the hole can be conducted simultaneously. Therefore, single-layer circuit board with metalized via hole can be directly achieved on the substrate via one time forming, without needing as prior art that, it need to overlay thick metal foil to the substrate in advance and afterward implement etching thinning to metal foil to drill a hole on the substrate, and it need to further form conductive layer on the hole wall via process of chemical electroless copper or black hole, shadow or the like, to obtain metalized via hole. Compared to prior art, the process procedure of the methods above is significantly shorter, and can decrease the using of etching liquid, facilitating protection of the environment. Additionally, via adjusting various process parameter, these methods very easily achieve very thin circuit pattern layer in thickness(for example, below 12 µm, such as 5 µm, 7 µm, 9 µm or the like), the resultant single-layer circuit board can advantageously be applied to medium and high grade precision electronic product on the basis of HDI(high density interconnected base plate) and COF(flexible chip) technology.

Also, because of the existing of ion implantation layer in the hole wall, the single-layer circuit board achieved via several methods mentioned above can have very high binding force between the hole wall and the conductive seed layer (for example above 0.5N/mm, such as between 0.7-1.5N/mm, more specifically between 0.8-1.2N/mm), thus the conductive layer of the hole wall wouldn't easily fall off or scuff in the subsequent various fabrication or application process. Therefore, it facilitates improving the conductivity of the hole, facilitating achieving single-layer circuit board with good connectivity.

It should be noted that, although in the methods shown in FIG. 3 panel electroplating is utilized to form circuit pattern (i.e., successively forming conductor thickening layer, covering with photoresist film and implementing exposure and development, implementing etching stripping), while in the methods shown in FIG. 5 pattern electroplating is utilized to form circuit pattern (i.e., successively covering with photoresist film and implementing exposure and development, implementing electroplating, implementing stripping etching), but it is easily understood that, it can also be that, first forming a conductor thickening layer on the conductive seed layer, then implementing panel electroplating based on that, or it can also be that, implementing pattern electroplating directly on the conductive seed layer (for example in the circumstance that the conductive seed layer is thick).

several methods of manufacturing single-layer circuit board is described above, in the following, several method embodiment of manufacturing multi-layer circuit board will be described according to the invention.

Figure 7:
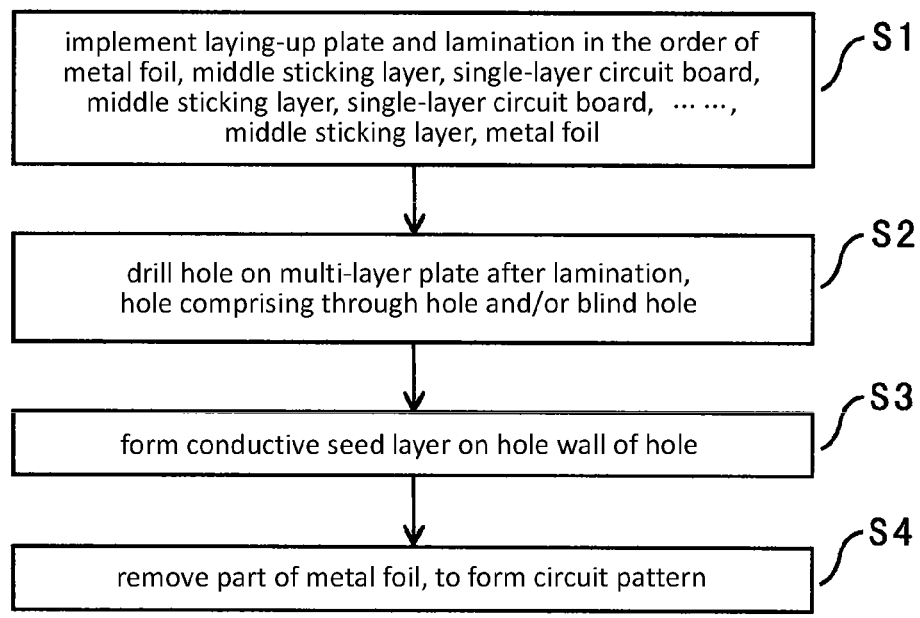
FIG. 7 represents flowchart of methods for manufacturing multi-layer circuit board according to the fourth embodiment of the invention.
Figure 8:
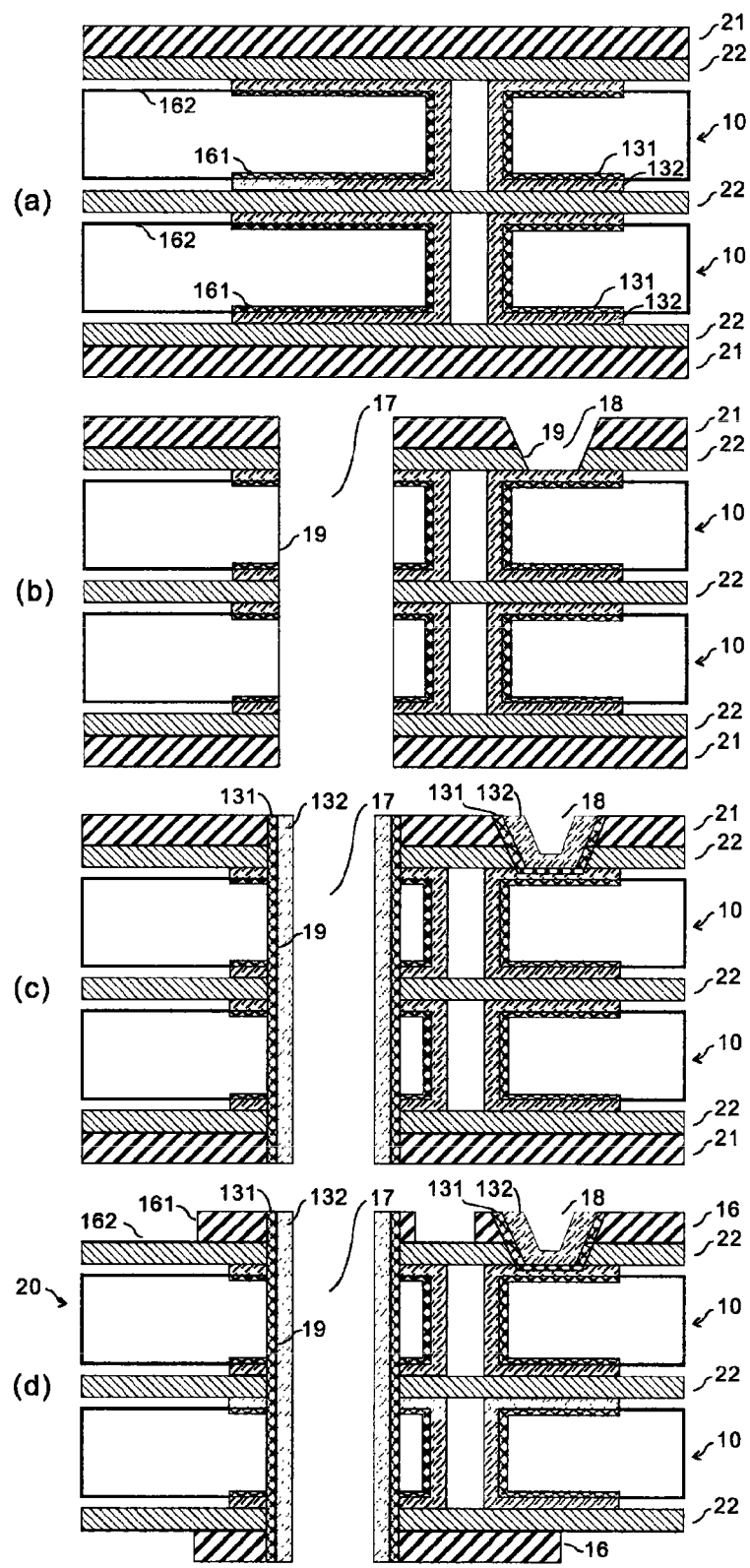
FIG. 8 represents sectional schematic view of respective product of each step of the methods shown in FIG. 7.

FIG. 7 represents flowchart of methods for manufacturing multi-layer circuit board according to the fourth embodiment of the invention, while FIG. 8 represents sectional schematic view of respective product of each step of the methods shown in FIG. 7. As shown in FIG. 7, such methods comprise the following steps: implementing laying-up plate and lamination in the order of metal foil, middle sticking layer, single-layer circuit board, middle sticking layer, single-layer circuit board, middle sticking layer, metal foil (step S1); drilling a hole on the multi-layer plate after lamination, the hole comprises blind hole and/or through hole (S2); forming a conductive seed layer on the hole wall of the hole (S3); and removing part of the metal foil, to form circuit pattern (S4). FIG. 8 (*a*), (*b*), (*c*) and (*d*) respectively corresponds to step S 1, S2, S3 and S4. In the following, reference is made to FIG. 7 and FIG. 8 simultaneously, illustrating each step of such methods in detail.

In step S1, the layer number of single-layer circuit board can be adjusted according the need, for example it can be one layer or multi-layer. When the layer number of single-layer circuit board is one layer, it can finally obtain three-layers circuit board, while when the layer number of single-layer circuit board is two layers, it can finally obtain four-layers circuit board. Also, each single-layer circuit board can be the same or different circuit board. As an example of metal foil, a material with good conductivity of copper foil or aluminum foil or the like is usually used. Additionally, middle sticking layer is used to stitch together between single-layer circuit board, and between single-layer circuit board and metal foil, it can usually use PP, PI, PTO, PC, PSU, PES, PPS, PS, PE, PEI, PTFE, PEEK, PA, PET, PEN, LCP, PPA or the like, or pure resin adhesive film without containing glass fabric (for example epoxy resin adhesive film). Additionally, each sticking layer between each single-layer circuit board, and between single-layer circuit board and metal foil can be made by the same material, also can be made by different material. In the example shown in FIG. 8(*a*), two layer of single-layer circuit board 10 prepared via methods shown in FIG. 1 is utilized, such single-layer circuit board 10 is provided with a hole and formed with ion implantation layer 131 implanted below the hole wall and below partial surface and plasma deposition layer 132 adhered above such ion implantation layer. Of course, single-layer circuit board used here can also be single-layer circuit board only having ion implantation layer 131 as shown in FIG. 2, with a hole having conductive layer or without a hole, and it can also be circuit board achieved utilizing metal foil which is common in the art. Also, the middle sticking layer used here also can be sticking layer having a hole especially through hole, wherein the hole wall of the hole is formed with conductive layer. Such conductive layer can be the conductive seed layer comprising ion implantation layer as described herein, it can also be metal layer formed via methods of conventional magnetron sputtering or the like, as long as it can be conductive.

Subsequently, drilling a hole on the multi-layer plate after lamination (step S2), such hole can comprise blind hole and/or through hole. Step S2 corresponds to step S1 in the methods shown in FIG. 1, it can utilize the same manner thereof. As shown in FIG. 8(*b*), through hole 17 and blind hole 18 is formed in the multi-layer plate after lamination, the through hole 17 runs through all the multi-layer plate, while the blind hole 18 only runs through metal foil 21 and middle sticking layer 22 adjacent such metal foil. Of course, it can only form through hole 17 or blind hole 18.

Then, forming conductive seed layer on the hole wall of the hole (S3). Such step S3 is similar to step S3 in the methods shown in FIG. 1; it can utilize the same manner thereof. The difference is that, because metal foil is located on the outer surface of multi-layer plate, the methods of the embodiment don't have to form conductive seed layer on the surface of the metal foil, but rather it only need to form the conductive seed layer on the hole wall. Of course, in the circumstance of implementing ion implantation or plasma deposition without taking protection measures to the metal foil, conductive seed layer will also formed on the outer surface of the metal foil. As shown in FIG. 8(*c*), the hole wall 19 of the through hole 17 and the blind hole 18, each are formed with a conductive seed layer constituted by ion implantation layer 131 implanted below the hole wall 19 and the plasma deposition layer 132 adhered above such ion implantation layer 131. Of course, when step S3 doesn't comprise plasma deposition, the conductive seed layer is only constituted by ion implantation layer 131 implanted below the hole wall 19.

Finally, removing part of the metal foil, to form circuit pattern (step S4). because the metal foil has conductivity, thus in such step, it only need to use common manner of etching or the like, to remove the metal foil in the no-circuit region, then if can gain multi-layer circuit board having surface circuit pattern. For example, in step S4, one layer of protection layer (for example tin) can be overlaid above the surface of the metal foil to be formed of circuit region, afterward implementing etching to remove the metal foil in the no-circuit region, thereby obtaining final circuit pattern.

As shown in FIG. 8(*d*), the metal foil 21 in the no-circuit region 162 is removed, only the metal foil 21 in the circuit region 161 is left, thereby forming circuit pattern 16. The multi-layer circuit board 20 achieved via above-mentioned methods is successively constituted by metal foil 21, middle sticking layer 22, single-layer circuit board 10, middle sticking layer 22, single-layer circuit board 10, middle sticking layer 22, metal foil 21, such multi-layer circuit board 20 is provided with hole 17, 18, a conductive seed layer is formed on the hole wall of the hole 19, and partial region of the metal foil 21 is removed to form circuit pattern layer 16, wherein the conductive seed layer comprises the ion implantation layer 131 implanted below the hole wall 19 and the plasma deposition layer 132 adhered on such ion implantation layer 131. Of course, the conductive seed layer can also be constituted by the ion implantation layer 131. Also, multi-layer circuit board 20 further comprises through hole throughout such multi-layer circuit board, blind hole formed on the surface thereof, and blind hole formed in the single-layer circuit board and the middle sticking layer.

Alternatively, after step S3, before step S4, the methods of the embodiment can also comprise, forming a conductor thickening layer on the conductive seed layer, to improve its conductivity. The forming of conductor thickening layer be conducted via methods described above.

According to the methods shown in FIG. 8, a hole is formed in multi-layer circuit board, and an ion implantation layer is formed below the hole wall of such hole via ion implantation. As discussed above, ion implantation aids to form relatively large binding force between the substrate and the conductive seed layer, and can make the surface of the conductive seed layer have good uniformity and compactness, without easily occurring of pin hole phenomenon. Additionally, when micro-hole is metalized, problems of hole wall conductor layer being nonuniform and void or crack or the like will not occur, it thus can effectively improve the conductivity of the metalized hole.

Figure 9:
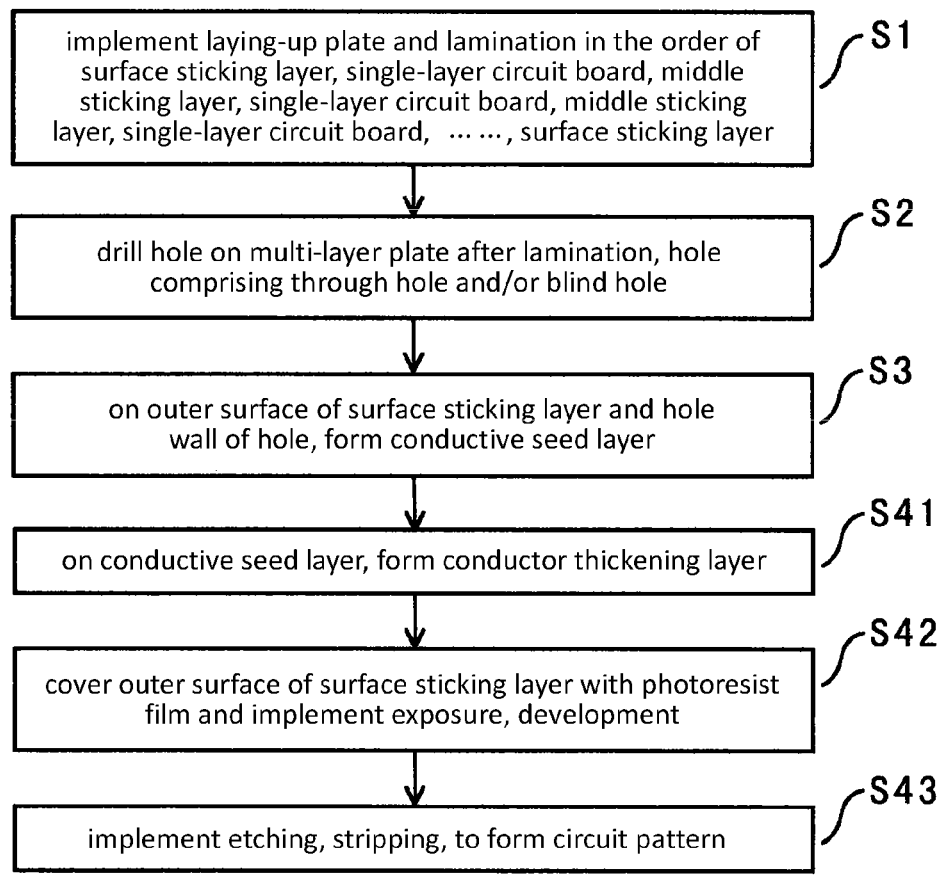
FIG. 9 represents flowchart of methods for manufacturing multi-layer circuit board according to the fifth embodiment of the invention.
Figure 10A:
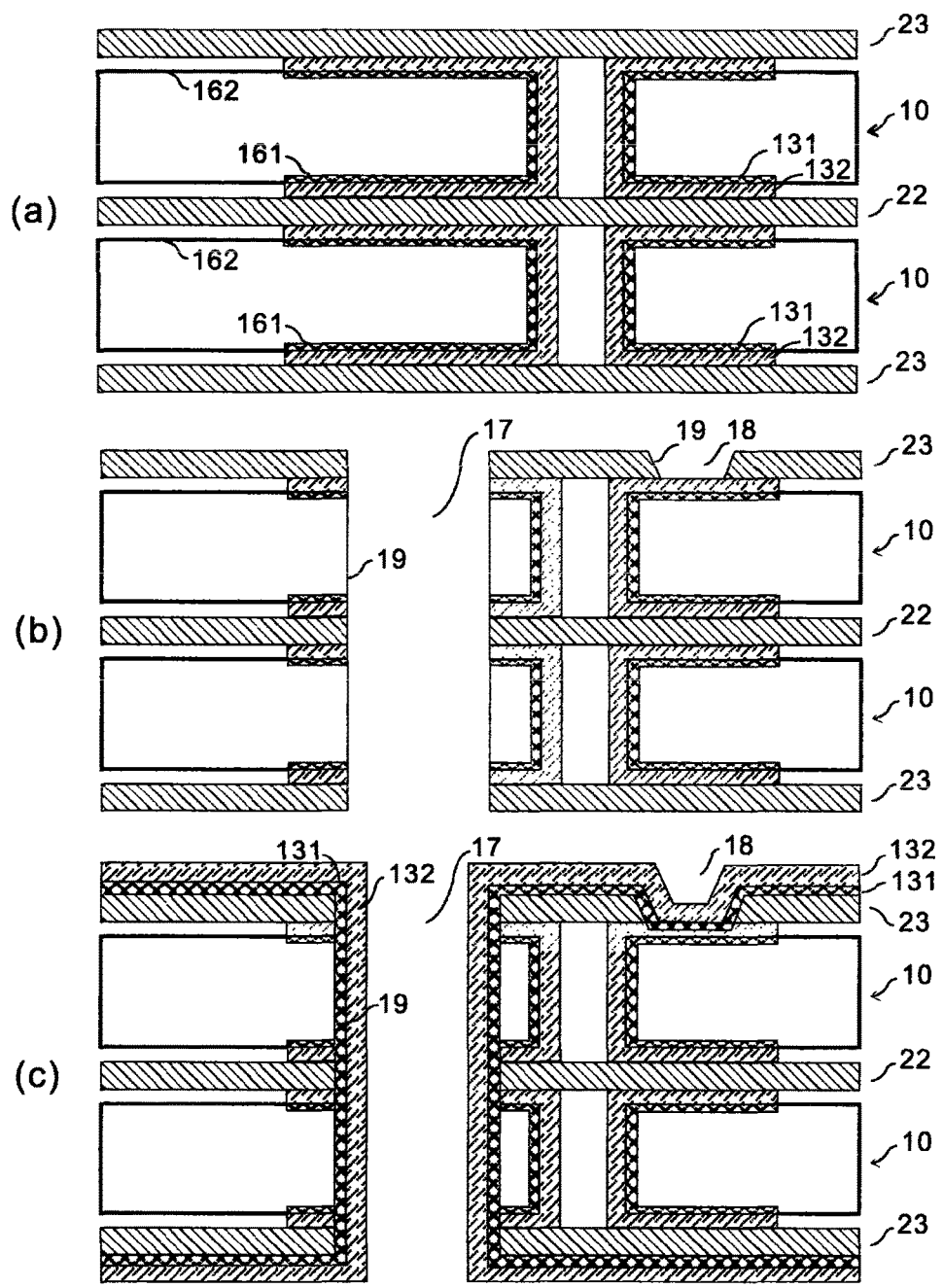
FIGS. 10A and 10B represent sectional schematic views of respective product of each step of the methods shown in FIG. 9.
Figure 10B:
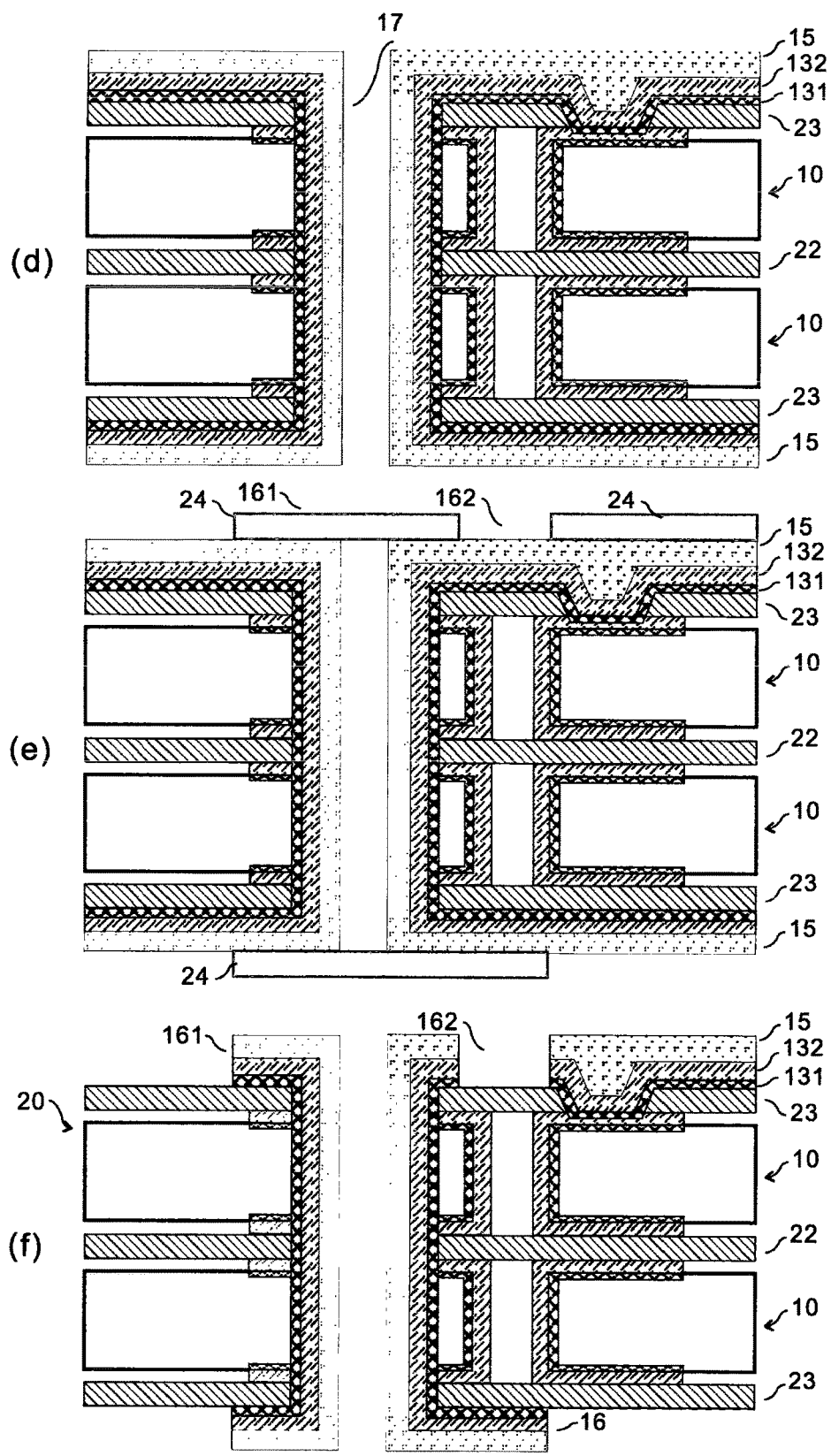

FIG. 9 represents flowchart of methods for manufacturing multi-layer circuit board according to the fifth embodiment of the invention, while FIGS. 10A and 10B represent sectional schematic views of respective products of each step of the methods shown in FIG. 9. As shown in FIG. 9, such methods comprise the following steps:

implementing laying-up plate and lamination in the order of surface sticking layer, single-layer circuit board, middle sticking layer, single-layer circuit board, . . . , surface sticking layer (step S1); drilling a hole on the multi-layer plate after lamination, the hole comprises blind hole and/or through hole (S2); forming a conductive seed layer on the outer surface of the surface sticking layer and the hole wall of the hole (S3); forming a conductor thickening layer on the conductive seed layer (S41); covering the outer surface of the surface sticking layer with a photoresist film and implementing exposure, development (S42); and implementing etching, stripping, to form circuit pattern (S43). wherein step S41 to S43 each are steps to form circuit pattern on the outer surface of the surface sticking layer, in the circumstance of forming conductor thickening layer utilizing electroplating, these steps can be generally known as "panel electroplating". FIGS. 10A (*a*), (*b*), (*c*), and 10B (*d*), (*e*) and (*f*) respectively correspond to above-mentioned step S1, S2, S3, S41, S42 and S43.

In the methods of present embodiment, step S1 is similar to step S1 in the methods shown in FIG. 7, the difference is that metal foil is not utilized; step S2 corresponds to step S2 in the methods shown in FIG. 7; step S3 is similar to step S3 in the methods shown in FIG. 7, the difference is that, the conductive seed layer is formed not only on the hole wall of the hole, but also on the outer surface of the surface sticking layer. Additionally, step S41 to S43 respectively corresponds to step S31 to S33 n the methods shown in FIG. 3, it can utilize similar panel electroplating manner thereof.

As shown in FIG. 10B (*f*), via multi-layer circuit board 20 achieved by the methods of the embodiment is constituted successively by surface sticking layer 23, single-layer circuit board 10, middle sticking layer 22, single-layer circuit board 10, surface sticking layer 23, such multi-layer circuit board 20 is provided with hole 17, 18, a conductive seed layer is formed on the hole wall of the hole 19, and a circuit pattern layer having a conductive seed layer 16 is formed on partial outer surface of the surface sticking layer 23, wherein the conductive seed layer comprises ion the implantation layer 131 implanted below the hole wall 19 and below partial outer surface of the surface sticking layer 23 and the plasma deposition layer 132 adhered on such ion implantation layer 131.

Of course, the conductive seed layer can also be constituted by the ion implantation layer 131. Circuit pattern layer 16 further comprises conductor thickening layer 15, of course this is not necessary.

Figure 11:
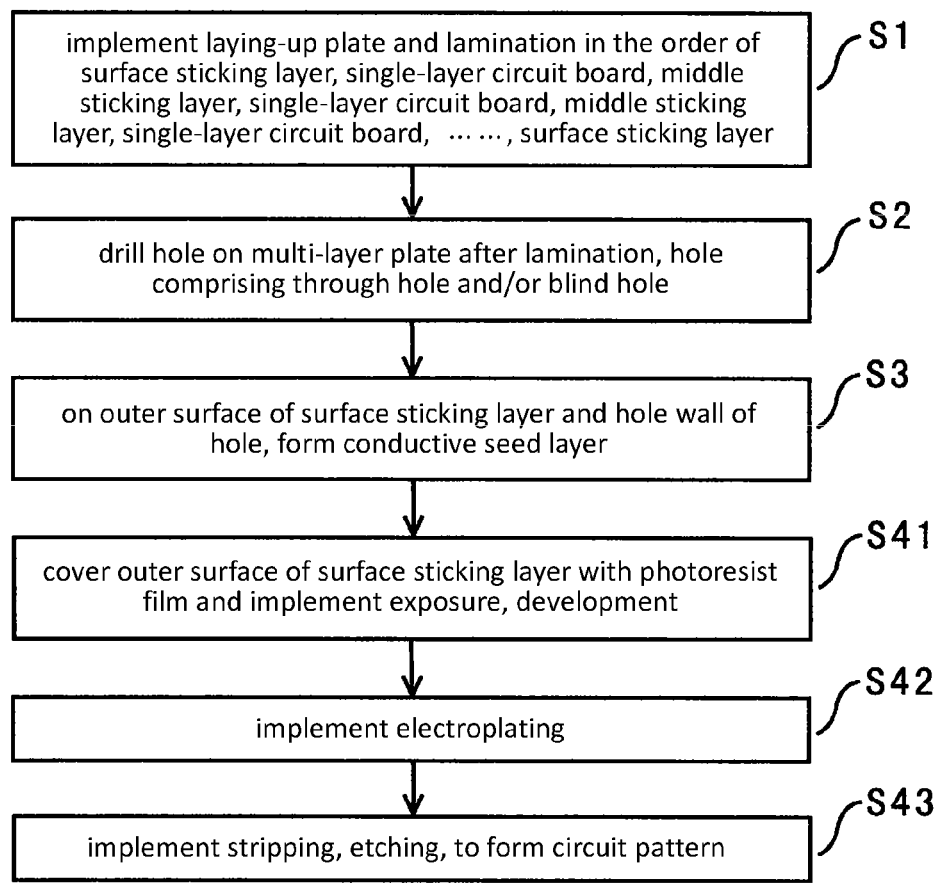
FIG. 11 represents flowchart of methods for manufacturing multi-layer circuit board according to the sixth embodiment of the invention.
Figure 12A:
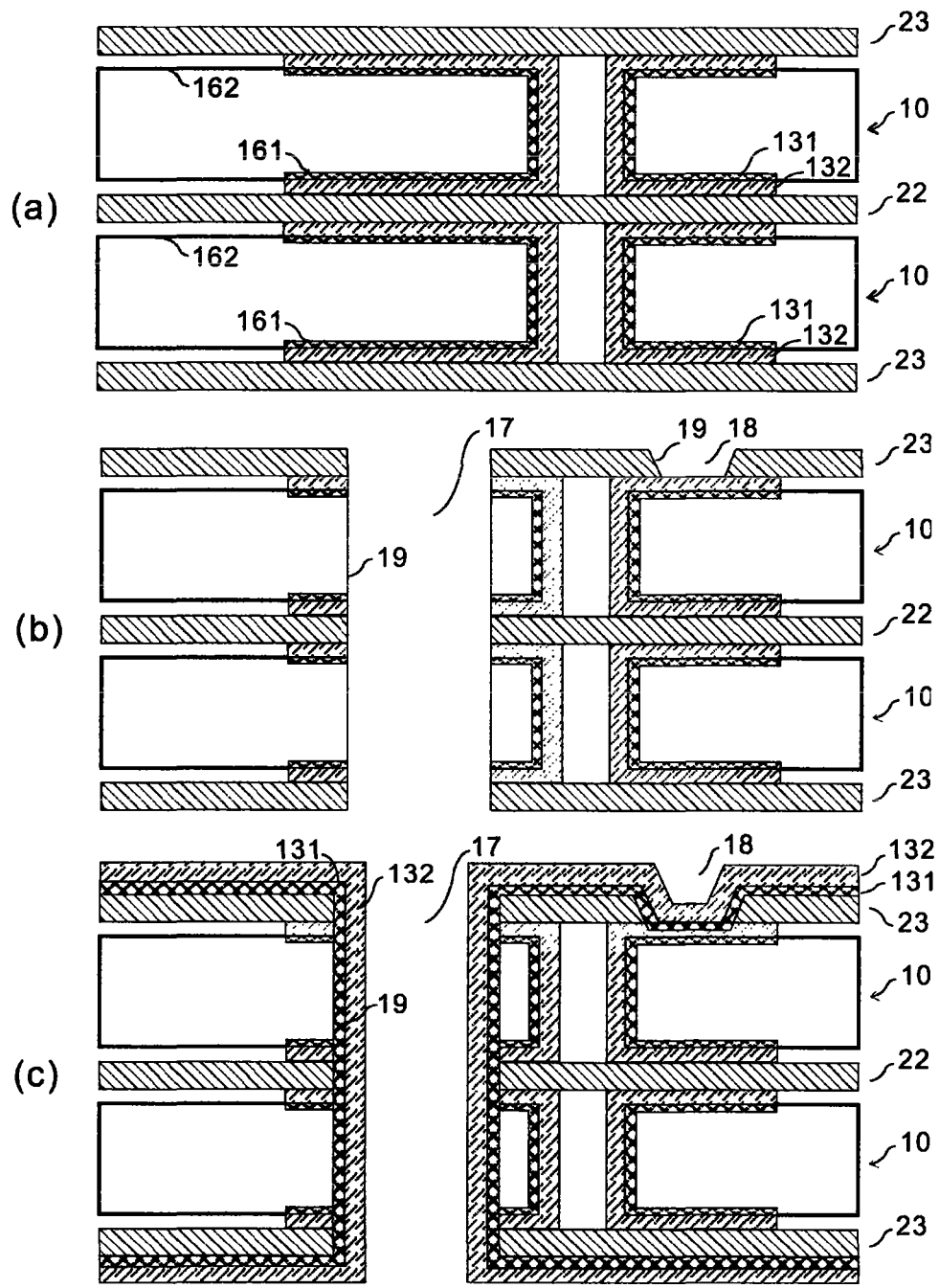
FIGS. 12A and 12B represent sectional schematic views of respective product of each step of the methods shown in FIG. 11.
Figure 12B:
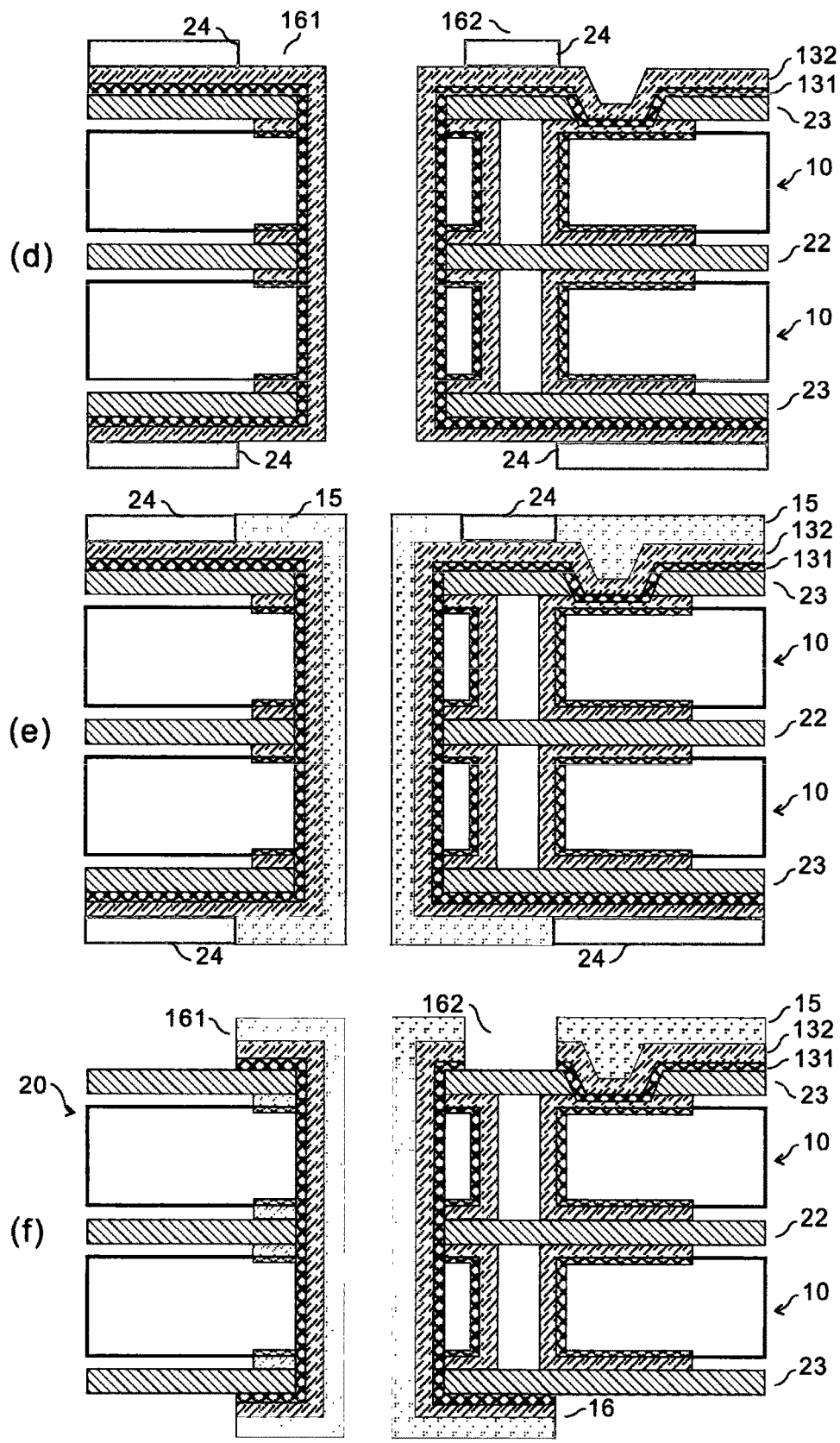

FIG. 11 represents flowchart of methods for manufacturing multi-layer circuit board according to the sixth embodiment of the invention, while FIGS. 12A and 12B represent sectional schematic views of respective products of each step of the methods shown in FIG. 11. Such methods comprises the following steps: implementing laying-up plate and lamination in the order of surface sticking layer, single-layer circuit board, middle sticking layer, single-layer circuit board, surface sticking layer (step S1); drilling a hole on the multi-layer plate after lamination, the hole comprises blind hole and/or through hole (S2); forming a conductive seed layer on the outer surface of the surface sticking layer and the hole wall of the hole (S3); covering the outer surface of the surface sticking layer with a photoresist film and implementing exposure, development (S41); implementing electroplating (S42); and implementing stripping, etching, to form circuit pattern (S43). wherein step S41 to S43 each are steps to form circuit pattern on the outer surface of the surface sticking layer, generally known as "pattern electroplating". Compared to the methods shown in FIG. 9, the difference of the methods of this embodiment is that, pattern electroplating is utilized rather than panel electroplating to form circuit pattern. FIGS. 12A (*a*), (*b*), (*c*), and 12B (*d*), (*e*) and (*f*) respectively corresponds to above-mentioned step S1, S2, S3, S41, S42 and S43.

In the methods of present embodiment, step S1, S2 and S3 respectively corresponds to step S1, S2 and S3 in the methods shown in FIG. 9, it can be conducted utilizing various methods above described for FIG. 9. Additionally, step S41 to S43 respectively correspond to step S31 to S33 in the methods shown in FIG. 5, it can utilize similar panel electroplating manner thereof. As shown in FIG. 12B (f), the multi-layer circuit board 20 achieved via the methods of this embodiment has the same configuration with the multi-layer circuit board 20 shown in FIG. 10B (f).

According to the methods of manufacturing multi-layer circuit board shown in FIG. 9 or FIG. 11, the metalization of the outer surface of the surface sticking layer and metalization of the hole can be conducted simultaneously. Therefore, multi-layer circuit board having metalized via hole and surface circuit pattern can be directly achieved on the substrate via one time forming, without needing as prior art that, it need to overlay thick metal foil in advance and afterward implement etching thinning to metal foil to drill a hole on the substrate, and it need to further form conductive layer on the hole wall via process of chemical electroless copper or black hole, shadow or the like, to obtain metalized via hole. Compared to prior art, the process procedure of the methods above is significantly shorter, and can decrease the using of etching liquid, facilitating protection of the environment. Additionally, via adjusting various process parameter, these methods very easily achieve very thin circuit pattern layer in thickness(for example, below 12 μm, such as 5 μm, 7 μm, 9 μm or the like), the resultant multi-layer circuit board can advantageously be applied to medium and high grade precision electronic product on the basis of HDI (high density interconnected base plate) and COF (flexible chip) technology.

Also, because of the existing of ion implantation layer in the hole wall, the multi-layer circuit board achieved via several methods mentioned above can have very high binding force between the hole wall and the conductive seed layer, thus the conductive layer of the hole wall wouldn't easily fall off or scuff in the subsequent various fabrication or application process. Therefore, it facilitates improving the conductivity of the hole, facilitating achieving multi-layer circuit board with good connectivity.

The text above in detail describes methods of manufacturing single-layer circuit board, multi-layer circuit board, and particular configuration of single-layer and multi-layer circuit board achieved via these methods according to the invention. In the following, several examples of implementing the invention will be illustrated by example, to increase the understanding of the invention.

EXAMPLE 1

Such example uses organic polymer thin film as substrate to make flexible circuit board having metalized hole, particularly utilizing liquid crystal polymer thin film (LCP film) as substrate.

First, the surface of LCP film is rubbed using gauze impregnated by alcohol, to remove the dirt adhered above. Subsequently, a series of through holes with the diameter of 20 μm are drilled on such LCP film utilizing laser drilling technology, then the surface of LCP film and the hole wall are thoroughly cleaned using blower or the like, to remove drilling scrap and other dirt left therein.

Then, one layer of photoresist film is painted on the cleaned LCP film substrate surface, and such substrate is placed on a lithography machine to implement exposure and development, afterward material in the region is washed away to form circuit pattern on the substrate surface (also known as circuit region), circuit negative image overlaid with photoresist film coating (also known as photoresist layer) is obtained. At the time, photoresist layer only exists in the no-circuit region on the substrate surface.

Subsequently, the substrate formed with photoresist layer having circuit negative image after exposure and development is placed into an oven to bake, subsequently it is transferred into an ion implantation equipment to implement ion implantation. In such ion implantation equipment, the ion implantation chamber is vacuumed to $8.5 \times 10^{-3}$Pa, Ni is used as target material, proper implanting voltage, implanting current selected, such that the ionized Ni ion has an implanting energy of about 60 keV, and ion implantation is implemented to the surface of LCP film substrate and the hole wall, Ni ion is implanted below the surface of LCP film substrate and below the hole wall. Afterward, Cu is used as target material, plasma deposition is implemented on the surface of LCP film and the hole wall. At the time, the voltage of plasma deposition can be adjusted to make the energy of deposited Cu ion is 1000 eV, such that the measured sheet resistivity of overlaying copper plate substrate after plasma deposition is less than $30\Omega/\square$.

Then, the copper film on LCP film substrate surface is thickened to 5 μm via magnetron sputtering methods. The particular process is: in the coating chamber of the magnetron sputtering machine, vacuuming to $10^{-2}$Pa, filling argon, adjusting the pressure therein to 10 Pa, implementing cleaning of the thin film surface, afterward vacuuming to be $10^{-3}$Pa, adjusting working voltage to be 500V, sputtering duty ratio to be 70%, using copper as target material, implementing sputtering to the surface of LCP film substrate and the hole wall, overlaying one layer of copper layer in a thickness of 5 μm above them.

Afterward, LCP film substrate formed with photoresist layer having circuit negative image, conductive seed layer and conductor thickening layer is placed into respective stripping liquid that can dissolve such photoresist layer, and is stirred or shocked to accelerate the dissolving of the photoresist layer. In the dissolving process of the photoresist layer, the conductive seed layer above such photoresist layer and the conductor thickening layer also peels off from the substrate surface into the stripping liquid therewith. After the photoresist layer with circuit negative image fully dissolves, proper detergent can be used to implement thorough washing to the surface of the substrate, afterward it is placed in the oven to bake, and desired circuit pattern can be obtained in this way on the surface of the substrate.

Finally, annealing treatment can be conducted to the achieved circuit board, i.e., placing the circuit board in the oven of 80-100° C. for baking 15 hours, to eliminate stress existing in the copper layer and preventing the copper layer rupture. Subsequently, the circuit board can be also placed into passivation liquid to soak for about 1 minute then it is took out for blow drying, to prevent copper from oxidation stain in the air, wherein passivation liquid is the water solution of benzotriazole and ramification thereof in a concentration of 1 g/L.

EXAMPLE 2

Such example uses epoxy glass fabric as substrate to manufacture rigid single-layer circuit board having metalized hole, in turn uses such single-layer circuit board to make multi-layer circuit board, particularly using FR-4 or FR-5 substrate of the epoxy glass fabric substrate.

First, the surface of FR-4 substrate is rubbed using gauze impregnated by alcohol; to remove the dirt adhered above. Subsequently, several through holes with the diameter of about 100 μm and several blind holes with the diameter of about 100 μm and in a depth of about 200 μm are drilled on such FR-4 substrate utilizing laser drilling technology. After drilling the holes, the surface of FR-4 substrate and the hole wall are further thoroughly washed using ultrasonic technology and baking treatment is implemented, to remove drilling scrap and other dirt left therein.

Subsequently, the substrate after baking is placed into an ion implantation equipment via feeding mechanism, the ion implantation chamber is vacuumed to $2 \times 10^{-3}$ Pa, Ni used as target material, proper implanting voltage, implanting current is selected, such that the implanting energy of Ni ion is 30 keV, and Ni ion is implanted below the surface of FR-4 substrate and below the hole wall. Afterward, Cu is used as target material, plasma deposition is implemented on the the surface of FR-4 substrate and the hole wall. The voltage of plasma deposition can be adjusted to make the energy of deposited Cu ion to be 1000 eV, such that the measured sheet resistivity of FR-4 substrate formed with conductive seed layer is less than 50Ω/□.

subsequently, one layer of photoresist film is sticked on the surface of FR-4 substrate formed with conductive seed layer, and such substrate is placed on a lithography machine to implement exposure and development, afterward material in the circuit region on the substrate surface is washed away, obtaining photoresist layer having circuit negative image. At the time, photoresist layer only exists in the no-circuit region on the substrate surface, but conductive seed layer also exists below such photoresist layer.

Then, the copper film in the circuit region on the substrate surface is thickened to 5 μm on electroplating copper producing line. The constituting components of electroplating liquid are copper sulfate 100 g/L, sulfuric acid 50 g/L, chlorine ion concentration 30 mg/L and a small amount of additive; the current density of electroplating is set to be 1 A/dm$^2$; temperature is set to be 10° C. In the electroplating process, photoresist layer can't be coated by copper layer because of the insulated property thereof. That is to say, electroplated conductor thickening layer will only exist in the region on the substrate surface where photoresist layer doesn't exist, i.e., circuit region.

Afterward, FR-4 substrate formed with conductive seed layer, photoresist layer having circuit negative image, and conductor thickening layer placed into respective stripping liquid that can dissolve such photoresist layer, and is stirred to accelerate the dissolving of the photoresist layer. After the photoresist layer fully dissolves, the conductive seed layer below it will be exposed. Subsequently, one layer of tin on the conductor thickening layer of the substrate surface overlaid as protection layer, afterward etching is implemented to the substrate, to remove the conductive seed layer outside of the region of conductor thickening layer (i.e. circuit region). Finally, the plated tin layer on the conductor thickened layer is torn off and desired circuit pattern is obtained. Alternatively, it also can be that, first one layer of tin is overlaid on the conductor thickening layer of the substrate surface as protection layer, then photoresist layer is removed using stripping liquid, subsequently the conductive seed layer originally located below the photoresist layer is removed via etching. As such, single-layer circuit board with metalized hole and surface circuit pattern is obtained.

Subsequently, epoxy resin adhesive film used as sticking layer, laying-up plate is implemented successively in the order of copper foil, epoxy resin adhesive film, single-layer circuit board, epoxy resin adhesive film, single-layer circuit board, epoxy resin adhesive film, copper foil from down to up, and it is placed into a press machine for lamination, to form multi-layer plate. Of course, according to the need, more or less layer number of single-layer circuit board can be also utilized.

Then, mechanical drilling bit is used to drill several through holes with the diameter of about 100 μm on the resultant multi-layer plate, and drill several blind holes with the diameter of about 100 μm on the upper layer of copper foil and epoxy resin adhesive film. After drilling the holes, the surface of multi-layer plate and the wall surface of the hole are further thoroughly cleaned using ultrasonic technology and baking treatment is implemented, to remove drilling scrap and other dirt left therein.

Then, hole metalization is implemented to the formed through hole and blind hole. In particular, the multi-layer plate after baking and cleaning is placed into the ion implantation equipment via feeding mechanism, the ion implantation chamber is vacuumed to $2 \times 10^{-3}$ Pa. Ni is used as target material, proper implanting voltage, implanting current is selected, such that the implanting energy of Ni ion is 30 keV, and Ni ion is implanted within the upper and lower surface and the hole wall of the multi-layer plate, forming ion implantation layer. Afterward, Cu is selected as target material, plasma deposition is implemented on the upper and lower surface and the hole wall of the multi-layer plate, forming plasma deposition layer. The voltage of plasma deposition can be adjusted to make the energy of deposited Cu ion to be 1000 eV, such that the measured sheet resistivity of the FR-4 substrate formed with conductive seed layer is less than 50Ω/□. Then, the copper film on the conductive seed layer is thickened to 5 μm on the electroplating copper producing line. The constituting components of electroplating liquid are copper sulfate 100 g/L, sulfuric acid 50 g/L, chlorine ion concentration 30 mg/L and a small amount of additive; the electroplated current density is set to be 1 A/dm$^2$; temperature is set to be 10° C.

Subsequently, on the upper layer copper foil of the multi-layer plate formed with metalized hole, desired circuit pattern is gained via pattern electroplating methods. That is to say, the surface of the copper foil (for example YQ-30SD film or AQ-2058 film which is negative) is covered with photoresist film upper layer, exposure and development are implemented, afterward the material in the no-circuit region is washed away. At the time, photoresist layer only exists in the circuit region on the copper foil surface, while the copper foil in the no-circuit region is exposed. Subsequently, etching is implemented utilizing acidic etching liquid (HCl+CuCl$_2$), to remove the copper foil in the no-circuit region. Then, NaOH solution utilized to implement stripping, stripping the photoresist film still covering on the copper foil, so as to expose the copper foil below, and finally obtaining desired surface circuit pattern.

Optionally, annealing treatment can also be conducted to the achieved multi-layer circuit board, to eliminate the stress existing therein, preventing copper foil rupture, the particular process can be: placing the multi-layer circuit board in the oven of 100-120° C. for baking 12 hours.

Subsequently, the circuit board after annealing treatment can be also placed into passivation liquid to soak for about 1 minute then it is took out for blow drying, to prevent copper from oxidation stain in the air, wherein passivation liquid is the water solution of benzotriazole and ramification thereof in a concentration of 2 g/L.

EXAMPLE 3

This example uses double-face flexible overlaying copper plate with organic polymer thin film (for example, PI film)

as substrate to make single-layer circuit board, further uses such single-layer circuit board to make multi-layer circuit board.

First, single-layer circuit board is prepared. In particular, PI film is used as substrate, two surfaces of PI film are rubbed using gauze impregnated by alcohol, to remove the dirt adhered above. Subsequently, a series of through holes with the diameter of 10 μm on PI film are drilled utilizing ultraviolet laser drilling technology, and the surface and the hole wall of PI film are thoroughly washed using ultrasonic technology, to remove drilling scrap and other dirt left therein. Subsequently, PI film after drilling is placed into ion implantation equipment. In such ion implantation equipment, the ion implantation chamber is vacuumed to $1\times10^{-4}$Pa, Ni is used as target material, proper implanting voltage, implanting current is selected, such that the energy of implanting Ni ion is 40 keV, Ni ion is implanted within both the upper and lower surface and the hole wall of the PI film substrate. Afterward, Cu is selected as target material, plasma deposition is implemented on both the upper and lower surface and the hole wall of the multi-layer plate. The voltage of plasma deposition is adjusted to make the energy of deposited Cu ion to be 500 eV, such that the measured sheet resistivity of the PI film substrate formed with conductive seed layer is less than 40Ω/□.

Subsequently, the copper film PI film on the substrate surface is thickened to 5 μm on electroplating copper producing line. In such electroplating process, the constituting components of the electroplating liquid are copper sulfate 160 g/L, sulfuric acid 70 g/L, chlorine ion concentration 60 mg/L and a small amount of additive; electroplated current density is set to be 2.5 A/dm$^2$; temperature is set to be 25° C. Then, one layer of photoresist film is painted on the thickened copper layer of the PI film substrate, and it is placed in a lithography machine to conduct exposure and development, afterward the material in the no-circuit region on the substrate surface is washed away, obtaining circuit positive image overlaid by photoresist film. At the time, photoresist layer only exists in the circuit region on the conductive seed layer surface.

Afterward, etching is implemented to etch away the conductive seed layer in the no-circuit region; the circuit region is not etched because of the protection function of the photoresist film. Stripping liquid is used again to remove photoresist film, afterward the substrate after stripping is placed into the oven for baking, and desired circuit pattern is obtained on the surface of the substrate in this way. Thereby, single-layer circuit board with circuit pattern and metalized hole is gained; such single-layer circuit board can be subsequently used for manufacturing multi-layer circuit board.

Then, PP film is used as sticking layer, laying-up plate is implemented successively in the order of PP, single-layer circuit board, PP, single-layer circuit board, PP from down to up, and it is placed in a press machine for lamination, to form multi-layer plate. Subsequently, laser drilling technology is utilized, several through holes with the diameter of 10 μm are drilled on the resultant multi-layer plate, and several blind hole with the diameter of 10 μm is drilled on upper layer of PP. After drilling, the surface of the multi-layer plate and the hole wall of the hole is thoroughly cleaned utilizing technology of ultrasonic washing or the like, and drying treatment is implemented, to remove drilling scrap and other dirt or the like left therein.

Subsequently, the multi-layer plate after drilling is placed successively into ion implantation equipment and plasma deposition equipment, conductive seed layer on the surface of upper layer PP film and the hole wall of the hole is formed as described above. To form circuit, subsequently both the upper and lower surface of the upper PP film formed with thickening copper film (for example YQ-40PN film or ASG-302 film which is positive) are covered with a photoresist layer, and it is placed into a lithography machine to implement exposure and development, afterward unwanted photoresist film material in the circuit region is washed away, only the conductive seed layer in the circuit region is exposed. Then, the copper film of conductive seed layer in the circuit region of PP film surface and the hole wall is thickened to 5 μm via electroplating. After electroplating, then one layer of tin in a thickness of 8 μm is electroplated on its surface, to protect such plated copper layer in subsequent etching process. Subsequently, NaOH(or KaOH) solution is used to implement stripping, so as to expose the conductive seed layer outside of the circuit region. Then, alkalic etching liquid $NH_4Cl/NH_3.H_2O$ is used to etch the conductive seed layer outside the circuit region, and $HNO_3$ or $H_2O_2$ solution or the like is used to remove the tin on the plated copper layer surface in dedicated equipment, in this way multi-layer circuit board having circuit pattern is obtained. At the time, the multi-layer circuit board has the sectional structure as shown in FIG. 10B (f).

The above described content only mentions optimum embodiment of the present invention. However, the present invention is not limited to the particular embodiment described herein. It easily occurs to those skilled in the art that, without departing the range of subjective matter of the present invention, various obvious modification, adjustment and replacement can be made to these embodiments, to adapt it to particular situation. Actually, the patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for manufacturing single-layer circuit board, the method comprising:
   drilling a hole on a substrate, the hole comprises a blind hole and/or a through hole;
   on a surface of said substrate, forming a photoresist layer having a circuit negative image;
   forming a conductive seed layer on the surface of said substrate and a hole wall of said hole; and
   removing said photoresist layer, to form a circuit pattern on the surface of said substrate,
   wherein forming a conductive seed layer comprises, implanting a conductive material below the surface of said substrate and below the hole wall of said hole via ion implantation, to form an ion implantation layer as at least part of said conductive seed layer.

2. The method of claim 1, wherein forming the conductive seed layer further comprises, depositing a conductive material above said ion implantation layer via plasma deposition, to form plasma deposition layer, said plasma deposition layer and said ion implantation layer constitute said conductive seed layer, wherein during said plasma deposition, the ions of said conductive material gain energy of 1-1000 eV, form plasma deposition layer in a thickness of 1-10000 nm.

3. The method of claim 1, wherein after forming the conductive seed layer and before removing said photoresist layer, said methods further comprises: via one or more of electroplating, chemical plating, vacuum evaporation, sputtering, utilizing one or more of Al, Mn, Fe, Ti, Cr, Co, Ni, Cu, Ag, Au, V, Zr, Mo, Nb and alloy thereof, forming a conductor thickening layer on said conductive seed layer.

4. The method of claim 1, wherein during said ion implantation, the ions of said conductive material gain energy of 1-1000 keV, are implanted below the surface of said substrate and below the hole wall of said hole for a depth of 1-500 nm, and form a steady doping structure with said substrate.

* * * * *